United States Patent
Bentley et al.

(10) Patent No.: US 10,056,377 B2
(45) Date of Patent: Aug. 21, 2018

(54) METAL LAYER ROUTING LEVEL FOR VERTICAL FET SRAM AND LOGIC CELL SCALING

(71) Applicant: GLOBALFOUNDRIES Inc., Grand Cayman (KY)

(72) Inventors: Steven Bentley, Menands, NY (US); Bipul C. Paul, Mechanicville, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 15/786,164

(22) Filed: Oct. 17, 2017

(65) Prior Publication Data

US 2018/0145073 A1   May 24, 2018

Related U.S. Application Data

(62) Division of application No. 15/360,537, filed on Nov. 23, 2016, now Pat. No. 9,825,032.

(51) Int. Cl.

| H01L 21/8234 | (2006.01) |
|---|---|
| H01L 27/088 | (2006.01) |
| H01L 29/66 | (2006.01) |
| H01L 29/417 | (2006.01) |
| H01L 23/528 | (2006.01) |
| H01L 29/78 | (2006.01) |

(52) U.S. Cl.
CPC .. *H01L 27/0886* (2013.01); *H01L 21/823412* (2013.01); *H01L 21/823418* (2013.01); *H01L 21/823431* (2013.01); *H01L 21/823456* (2013.01); *H01L 21/823475* (2013.01); *H01L 23/5283* (2013.01); *H01L 29/41791* (2013.01); *H01L 29/66545* (2013.01); *H01L 2029/7858* (2013.01)

(58) Field of Classification Search
CPC ..... H01L 21/823412; H01L 21/823418; H01L 21/823456
See application file for complete search history.

(56) References Cited

U.S. PATENT DOCUMENTS

| 9,312,388 B2 | 4/2016 | Xie et al. |
|---|---|---|
| 9,385,088 B2 | 7/2016 | Or-Bach et al. |
| 2016/0190065 A1 | 6/2016 | Liaw et al. |

*Primary Examiner* — Douglas Menz
(74) *Attorney, Agent, or Firm* — Ditthavong & Steiner, P.C.

(57) ABSTRACT

Methods of forming a VFET SRAM or logic device having a sub-fin level metal routing layer connected to a gate of one transistor pair and to the bottom S/D of another transistor pair and resulting device are provided. Embodiments include pairs of fins formed on a substrate; a bottom S/D layer patterned on the substrate around the fins; conformal liner layers formed over the substrate; a ILD formed over a liner layer; a metal routing layer formed between the pairs of fins on the liner layer between the first pair and on the bottom S/D layer between at least the second pair, an upper surface formed below the active fin portion; a GAA formed on the dielectric spacer around each fin of the first pair; and a bottom S/D contact xc or a dedicated xc formed on the metal routing layer adjacent to the GAA or through the GAA, respectively.

20 Claims, 36 Drawing Sheets

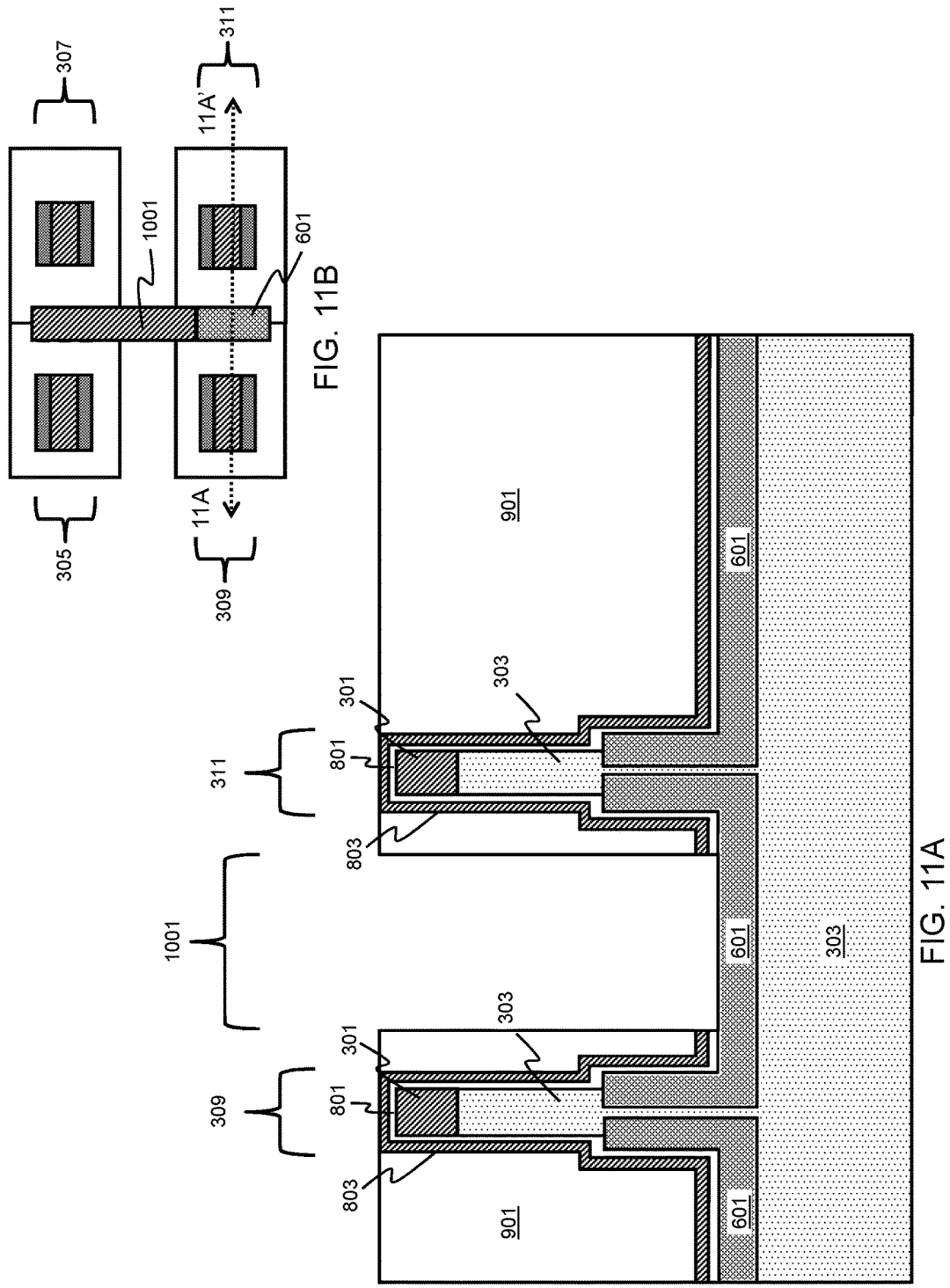

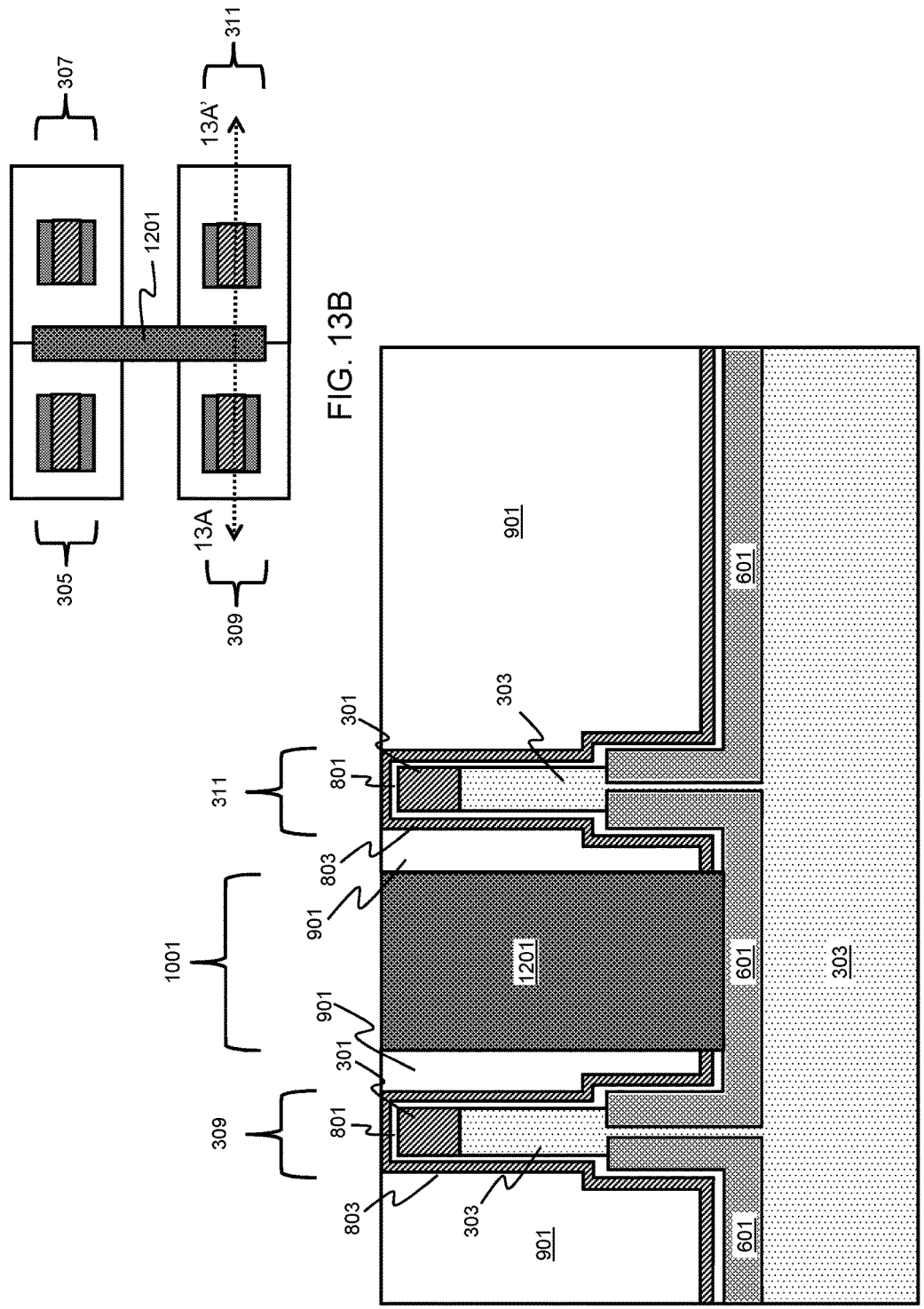

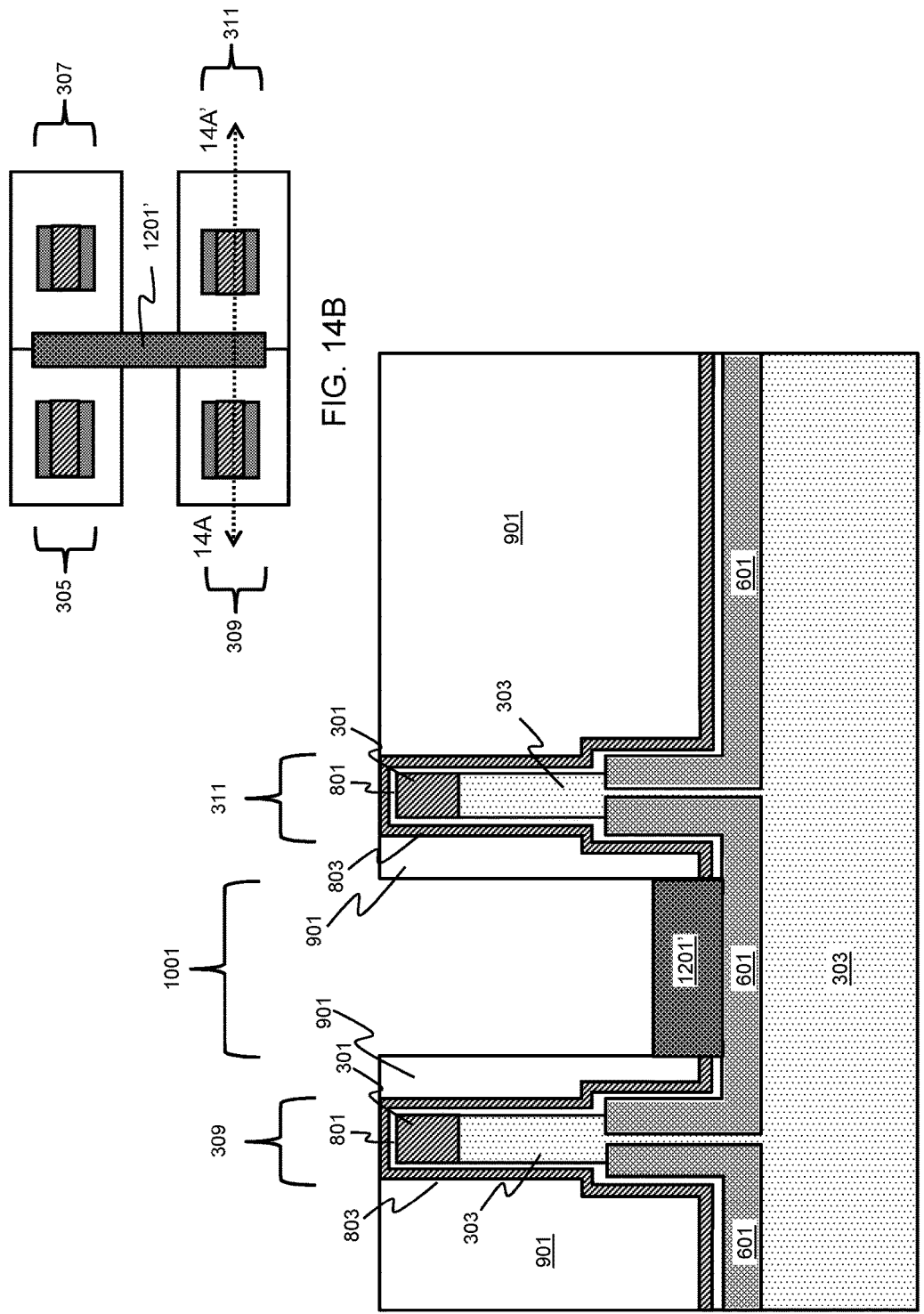

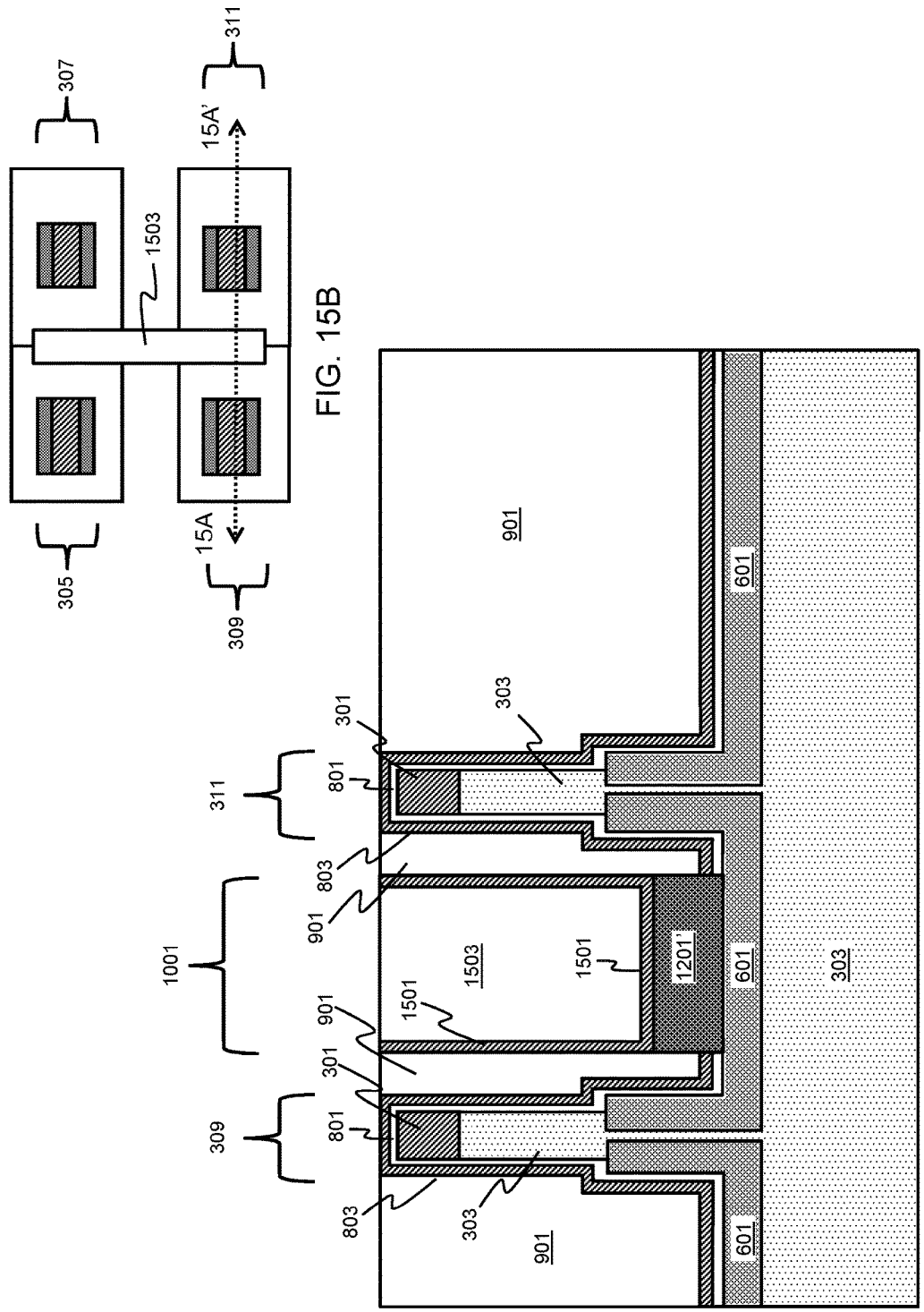

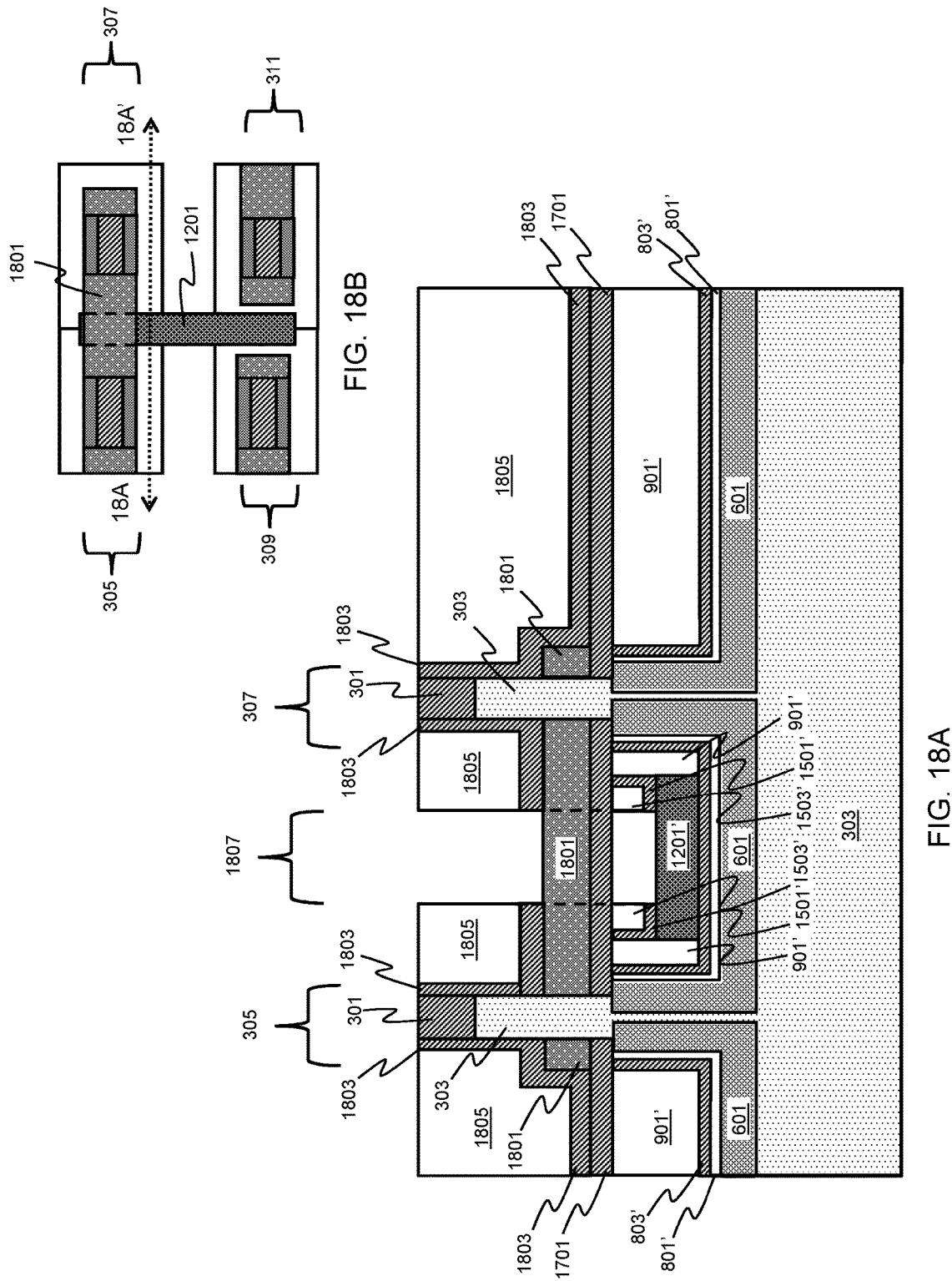

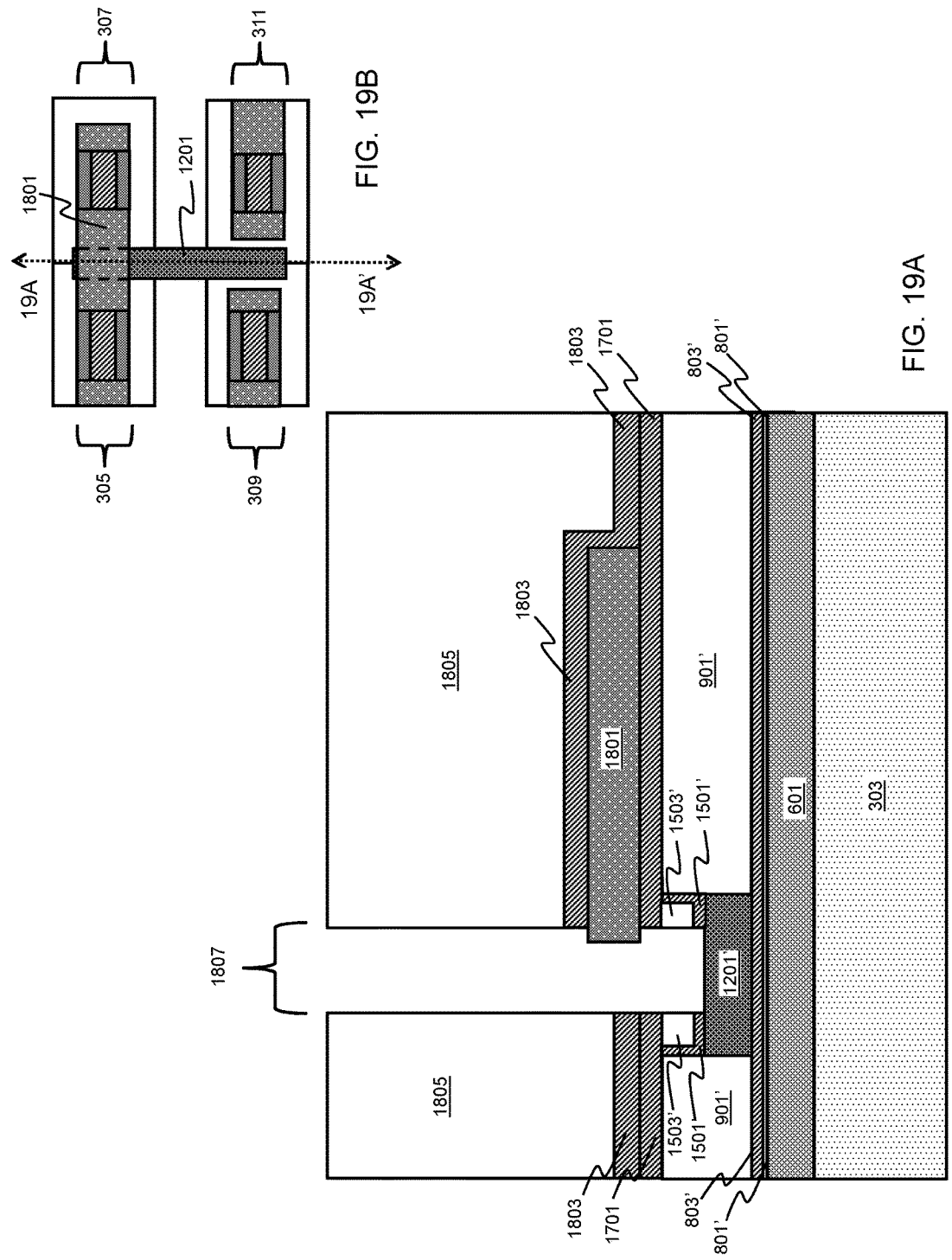

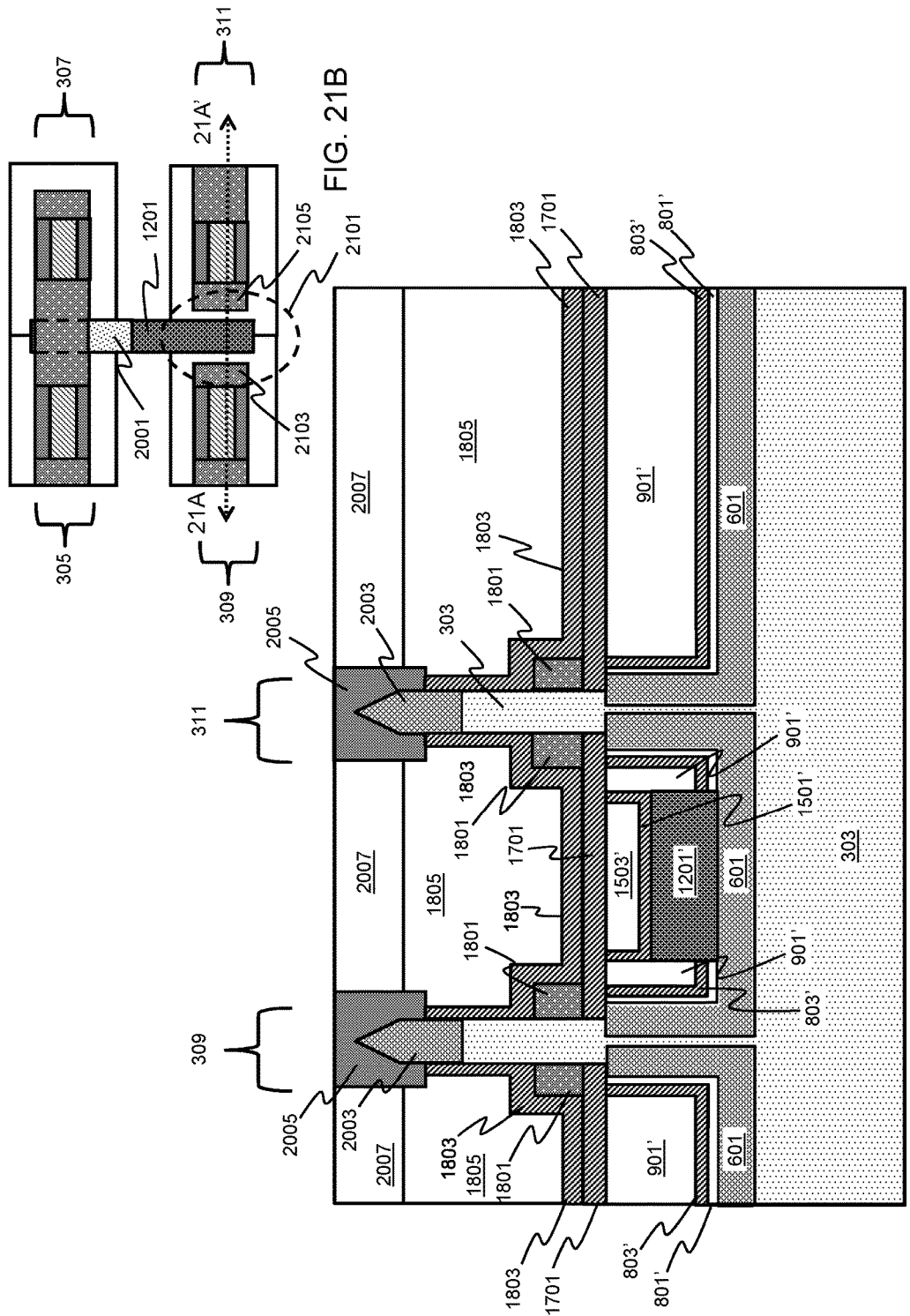

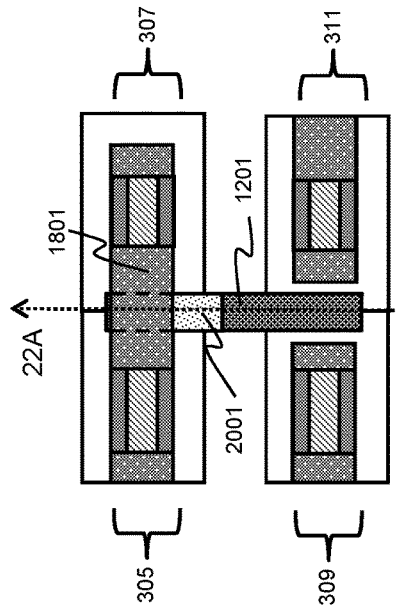
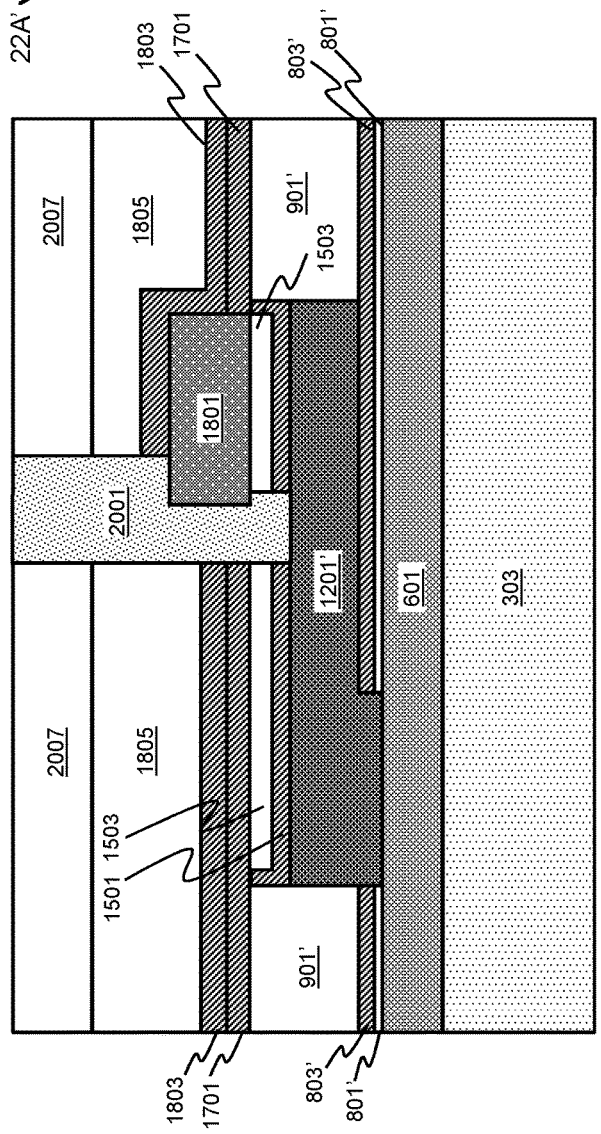
FIG. 22B
FIG. 22A

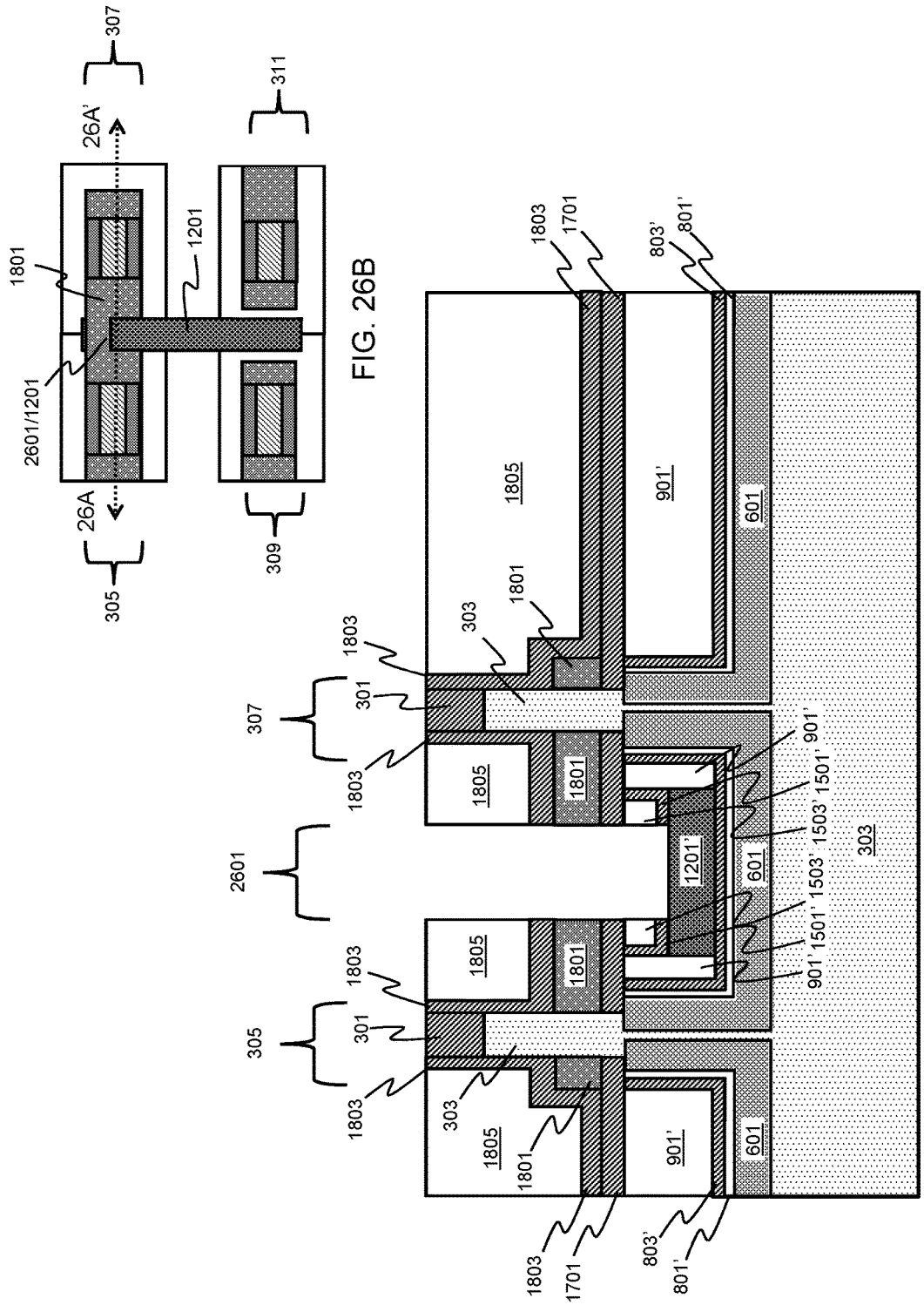

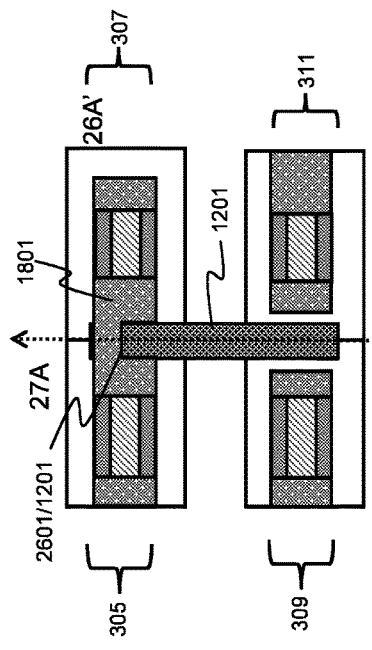
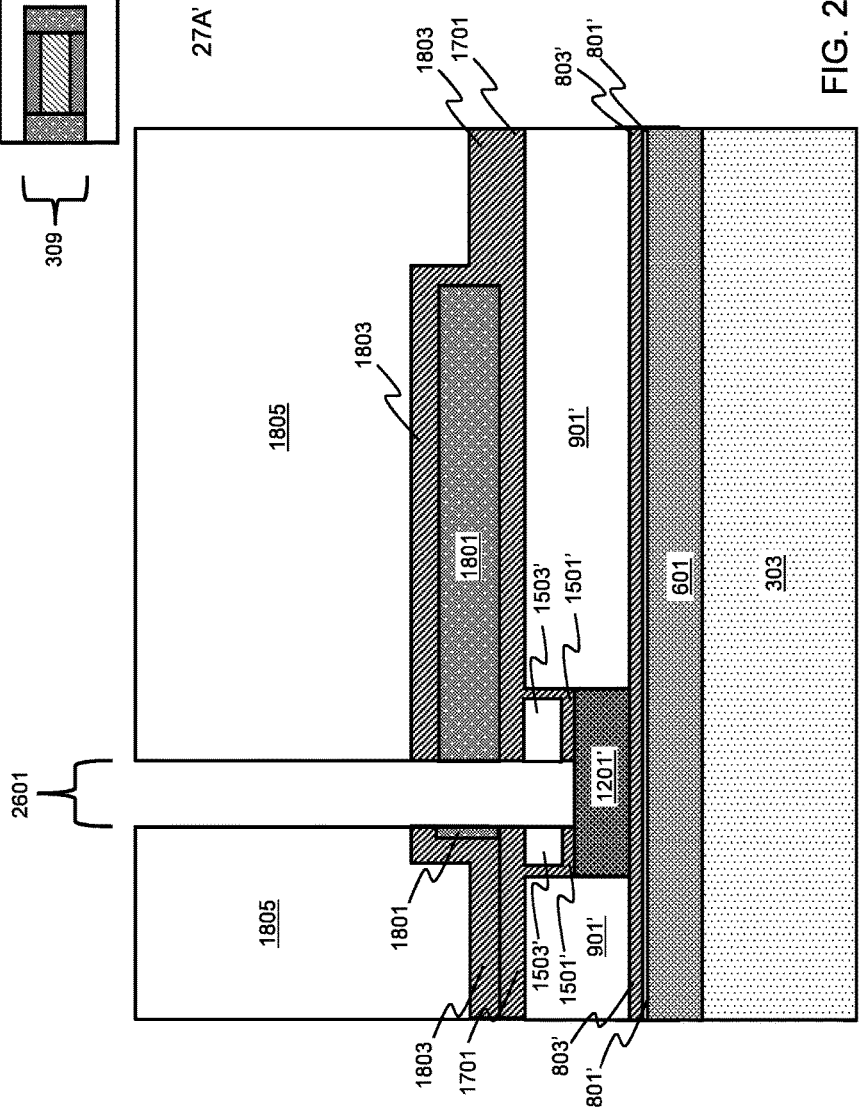
FIG. 27B
FIG. 27A

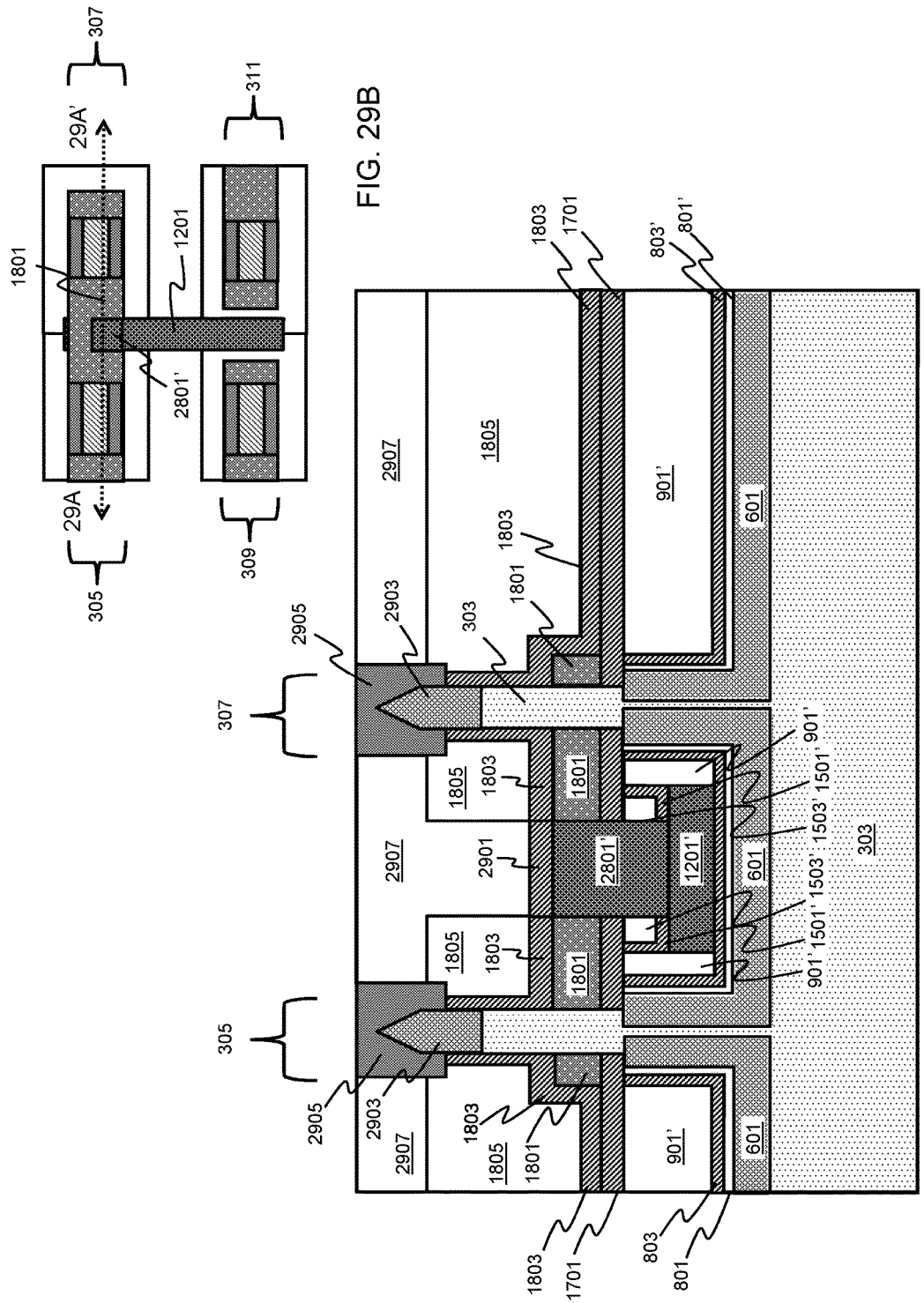

METAL LAYER ROUTING LEVEL FOR VERTICAL FET SRAM AND LOGIC CELL SCALING

RELATED APPLICATION

This application is a divisional of U.S. patent application Ser. No. 15/360,537 filed on Nov. 23, 2016, entitled "METAL LAYER ROUTING LEVEL FOR VERTICAL FET SRAM AND LOGIC CELL SCALING," which is incorporated herein by reference in its entirety.

TECHNICAL FIELD

The present disclosure relates to forming static random-access memory (SRAM) arrays. The present disclosure is particularly applicable to vertical field-effect transistors (VFETs).

BACKGROUND

Cell scaling is of critical importance to continued improvement of complementary metal-oxide-semiconductor (CMOS) technology. Whilst classical transistor scaling has historically provided a key driver via contacted gate (poly) pitch (CPP) and metal layer (MX) pitch reduction, at aggressively scaled geometries, basic layout restrictions begin to fundamentally limit cell scaling. Such scaling is particularly challenging for SRAMs, even with the implementation of new device geometries. In particular, gate-all-around (GAA) architectures promise further CPP scaling; however using conventional constructs, SRAM scaling is impeded by ground rules requirements. One specific implementation of the GAA architecture is the VFET, where the current flows through a vertically-oriented channel; since this is a tremendous change in the fundamental device, new layout concepts are also required for standard cell designs. One known VFET SRAM design is shown in FIG. 1. Adverting to FIG. 1 (top view), the known design includes n-type active (nRX) regions 101 (bottom source/drain (S/D) regions) and p-type active (pRX) regions 103. The VFET SRAM also includes pulldown (PD) transistors 109 (connected to a source supply voltage (VSS)), pullup (PU) transistors 111 (connected to a drain supply voltage (VDD)), and pass gate (PG) transistors 113. The PD, PU, and PG transistors 109, 111, and 113, respectively, include fins 115, S/D contact regions (CA) 117, gates (PC) 119, gate contacts (CB) 121, and bottom S/D contacts (TS) 123. In addition, the S/D contact regions 117 of the PG gates 113 are connected to bit lines (BL) and the gate contacts 121 are connected to word lines (WL). However, this known SRAM architecture does not enable significant scaling of the bitcell area due to various contact and isolation requirements. Another known VFET SRAM design including an abutting active (RX) structure, which eliminates pRX-pRX space and aligns two PU transistors, is shown in FIG. 2. Adverting to FIG. 2, the abutting VFET SRAM design includes nRX regions 201 and pRX regions 203. Similar to the VFET SRAM of FIG. 1, the VFET SRAM of FIG. 2 also includes PD transistors 205 (connected to a VS S), PU transistors 207 (connected to a VDD), and PG transistors 209. The PD, PU, and PG transistors 205, 207, and 209, respectively, include fins 211, top contacts (not shown for illustrative convenience) connected to S/D contact regions 213, gates 215, gate contacts 217, and cross-couple (xc) contacts 219 connected to the bottom nRX regions 201 and pRX regions 203, in this case using bottom S/D contact metals strapped to gates 215. However, the bottom S/D xc contact requirements as drawn in this fashion, using the bottom S/D contact to strap the gate 215 metal to bottom nRX regions 201 and pRX regions 203, are subject to the contact-gate ground rule spacing requirements, which significantly increases the n-p space, thereby limiting the overall scaling.

A need therefore exists for methodology enabling formation of an interconnect to implement a xc connection that enables scaling of the bitcell area without increasing the n-p space and the resulting device.

SUMMARY

An aspect of the present disclosure is a VFET SRAM or logic cell layout having a sub-fin level metal routing layer connected to a gate of one transistor pair and to the bottom S/D region of another transistor pair.

Another aspect of the present disclosure is a method of forming a sub-fin level metal routing layer connected to a gate of one transistor pair and to the bottom S/D region of another transistor pair of a VFET SRAM or logic cell device.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a device including: first and second pairs of fins formed on a substrate each fin having an active top and an inactive bottom portion, fins of each pair laterally separated in a first direction, and the pairs laterally separated from each other in a second direction perpendicular to the first; a bottom S/D layer patterned on the substrate around the fins; conformal first and second liner layers sequentially formed over the substrate; a first interlayer dielectric (ILD) formed over the conformal second liner layer; a metal routing layer formed in the second direction between the pairs of fins on the conformal second liner layer between the first pair and on the bottom S/D layer between at least the second pair, an upper surface formed below the active top portion; a first dielectric spacer formed over the first ILD; a GAA formed on the first dielectric spacer around each fin of the first pair; a second dielectric spacer formed over the GAA and first dielectric spacer; a bottom S/D contact xc or a dedicated xc formed on the metal routing layer adjacent to the GAA or through the GAA, respectively; and a second ILD formed over the substrate.

Aspects of the device include the fins of the first pair forming part of a PD and a first PU transistor, respectively, and the fins of the second pair forming part of a PG and a second PU transistor, respectively. Other aspects include a liner and oxide layer being formed between the metal routing layer and the first dielectric layer. Further aspects include the GAA being formed with a portion overlapping a portion of the metal routing layer. Another aspect includes top S/D contacts being formed on each fin.

Another aspect of the present disclosure is a method including: forming first and second pairs of fins on a substrate, each fin having an active channel portion and an inactive bottom portion including part of an access region, fins of each pair laterally separated in a first direction, and the pairs laterally separated in a second direction perpendicular to the first; patterning a bottom S/D layer on the substrate around the fins; forming conformal first and second liner layers sequentially over the substrate; forming a first ILD over the substrate coplanar with the conformal second liner layer; forming a trench in the ILD between each pair and between the pairs in the second direction; forming a metal routing layer along the trench, an upper surface formed below the top active portion; forming an oxide layer over the metal routing layer, an upper surface below a lower surface of the active top portion; forming a first dielectric spacer over the substrate; forming a GAA on the first dielectric spacer around each of the first pair of fins; forming a second dielectric spacer over the GAA and first dielectric spacer; and forming a second ILD layer over the substrate.

Aspects of the present disclosure include forming the first and second pairs of fins by: forming a hard mask over the substrate; etching the hard mask and substrate, revealing the active top portion; forming a bilayer sidewall spacer on sidewalls of the hard mask and active top portion; recessing the substrate 40 nanometer (nm) to 100 nm, revealing the inactive bottom portion; recessing laterally a portion of the inactive bottom portion; and stripping the bilayer sidewall spacer subsequent to forming a bottom S/D layer in the inactive portion of the fin. Other aspects include forming the bottom S/D layer along sidewalls of the inactive bottom portion. Further aspects include forming the first and second pairs of fins and the bottom S/D layer by: forming the bottom S/D layer over the substrate; forming an active fin layer over the bottom S/D layer; forming a hard mask over the active fin layer; patterning the hard mask; etching the active fin layer down to the bottom S/D layer on each side of the patterned hard mask, revealing the active top portion; and recessing the bottom S/D layer around the active fin layer, revealing the inactive bottom portion. Additional aspects include forming the trench by: etching the first ILD down to the conformal second liner layer between fins of the first pair of fins; and etching the first ILD and conformal first and second liner layers down to the bottom S/D layer at least between fins of the second pair of fins. Another aspect includes prior to forming the oxide layer: recessing the metal routing layer until the upper surface is below the top active portion; forming a conformal third liner layer on sidewalls of the trench and on the metal routing layer; filling the trench with an oxide; recessing the oxide, ILD, and conformal third liner layer down to the upper surface of the inactive bottom portion; and stripping the conformal first and second liner layers from the active top portion. Other aspects include forming a trench adjacent to the GAA through the second ILD, second dielectric spacer, first dielectric spacer, oxide layer, and SiN liner down to the metal routing layer; and forming a trench silicide in the trench, the trench silicide connecting the metal routing layer and GAA. Further aspects include forming the GAA partially overlapping the metal routing layer. Additional aspects include forming a conformal third liner layer on sidewalls of the trench and on the metal routing layer; filling the trench with an oxide; recessing the oxide, ILD, and conformal third liner layer down to the upper surface of the inactive bottom portion; and stripping the conformal oxide and SiN layers from the active top portion, prior to forming the oxide layer; and forming an opening through the second ILD, second dielectric layer, GAA, first dielectric spacer, oxide layer, and the conformal third liner layer down to the metal routing layer; filling the opening with a metal layer; recessing the metal layer down to an upper surface of the GAA; forming a third dielectric spacer layer on the GAA in the opening of the second dielectric spacer layer; and forming a second oxide layer in the opening coplanar with the second ILD.

A further aspect of the present disclosure is a method including: forming a S/D layer over a substrate; forming a blanket dielectric layer over the S/D layer; forming a metal routing layer over the blanket dielectric layer; patterning the metal routing layer; forming a replacement metal gate (RMG) stack over the S/D and metal routing layers; forming a replacement fin trench through the RMG stack down to the S/D layer; forming a replacement fin stack in the replacement fin trench; forming a SiN cap over the replacement fin wider than the replacement fin; removing a portion of the RMG stack on each side of the SiN cap; and forming a GAA on a remaining portion of the RMG stack and around the replacement fin.

Aspects of the present disclosure include forming the RMG stack by: forming a first silicon boron carbon nitride (SiBCN), a silicon oxycarbide (SiOC), silicon oxycarbonitride (SiOCN), or silicon carbide (SiC) layer over the S/D and metal routing layers; forming a first oxide layer over the first SiBCN, SiOC, SiOCN, or SiC layer; forming a second SiBCN, SiOC, SiOCN, or SiC layer over the first oxide layer; and forming a second oxide layer over the second SiBCN, SiOC, SiOCN, or SiC layer. Other aspects include removing the portion of the RMG stack by: etching the RMG stack down to the first SiBCN, SiOC, SiOCN, or SiC layer on each side of the SiN cap and a portion of the second SiBCN, SiOC, SiOCN, or SiC layer remaining under the SiN cap. Further aspects include forming the RMG stack by: forming a first SiN layer over the S/D and metal routing layers; planarizing the first SiN layer down to the metal routing layer; forming a second SiN layer over the first SiN layer; forming an oxide layer over the second SiN layer; and forming a third SiN layer over the oxide layer. Additional aspects include removing the portion of the RMG stack by: etching the RMG stack down to the second SiN layer on each side of the SiN cap, a portion of the third SiN layer remaining under the SiN cap. Another aspect includes forming the replacement fin stack by: forming a second S/D layer on the S/D layer in the replacement fin trench; forming an active fin layer on the second S/D layer; and forming a third S/D layer on the active fin layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 3 through 9, 10A through 15A, 16, 17, and 18A through 22A schematically illustrate cross-sectional views of a process flow for forming a sub-fin metal routing layer for a VFET SRAM or logic cell device based on a subtractive fin late bottom S/D process, in accordance with an exemplary embodiment;

FIGS. 10B through 15B and 18B through 22B schematically illustrate top views of FIGS. 10A through 15A and 18A through 22A, respectively;

FIGS. 26A through 29A schematically illustrate a process flow for forming a sub-fin metal routing layer for a VFET SRAM or logic cell device capable of increased CPP scaling based on a subtractive fin late bottom S/D process, in accordance with another exemplary embodiment;

FIGS. 26B through 29B schematically illustrate top views of FIGS. 26A through 29A, respectively.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of space constraints and impediments to satisfying ground rules requirements attendant upon SRAM scaling.

Methodology and the resulting device in accordance with embodiments of the present disclosure include first and second pairs of fins formed on a substrate each fin having an active top and an inactive bottom portion, fins of each pair laterally separated in a first direction, and the pairs laterally separated from each other in a second direction perpendicular to the first. A bottom S/D layer is patterned on the substrate around the fins and conformal first and second liner layers are sequentially formed over the substrate. A first ILD is formed over the conformal second liner layer and a metal routing layer is formed in the second direction between the pairs of fins on the conformal second liner layer between the first pair and on the bottom S/D layer between at least the second pair, an upper surface being formed below the active top portion. A first dielectric spacer is formed over the first ILD. A GAA is formed on the first dielectric spacer around each fin of the first pair and a second dielectric spacer is formed over the GAA and first dielectric spacer. A bottom S/D contact xc or a dedicated xc is formed on the metal routing layer adjacent to the GAA or through the GAA, respectively, and a second ILD is formed over the substrate.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 3:
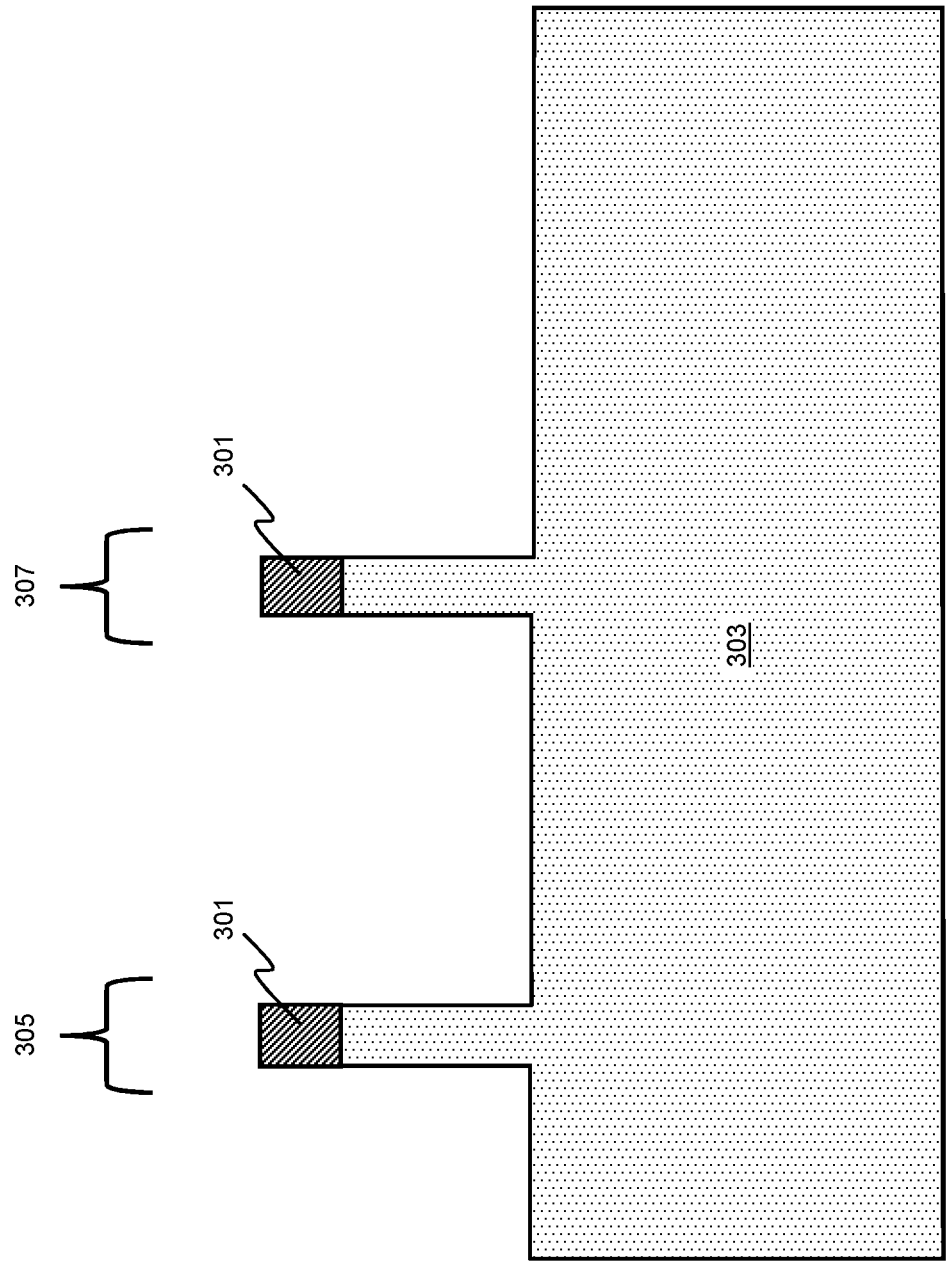
Figure 4:
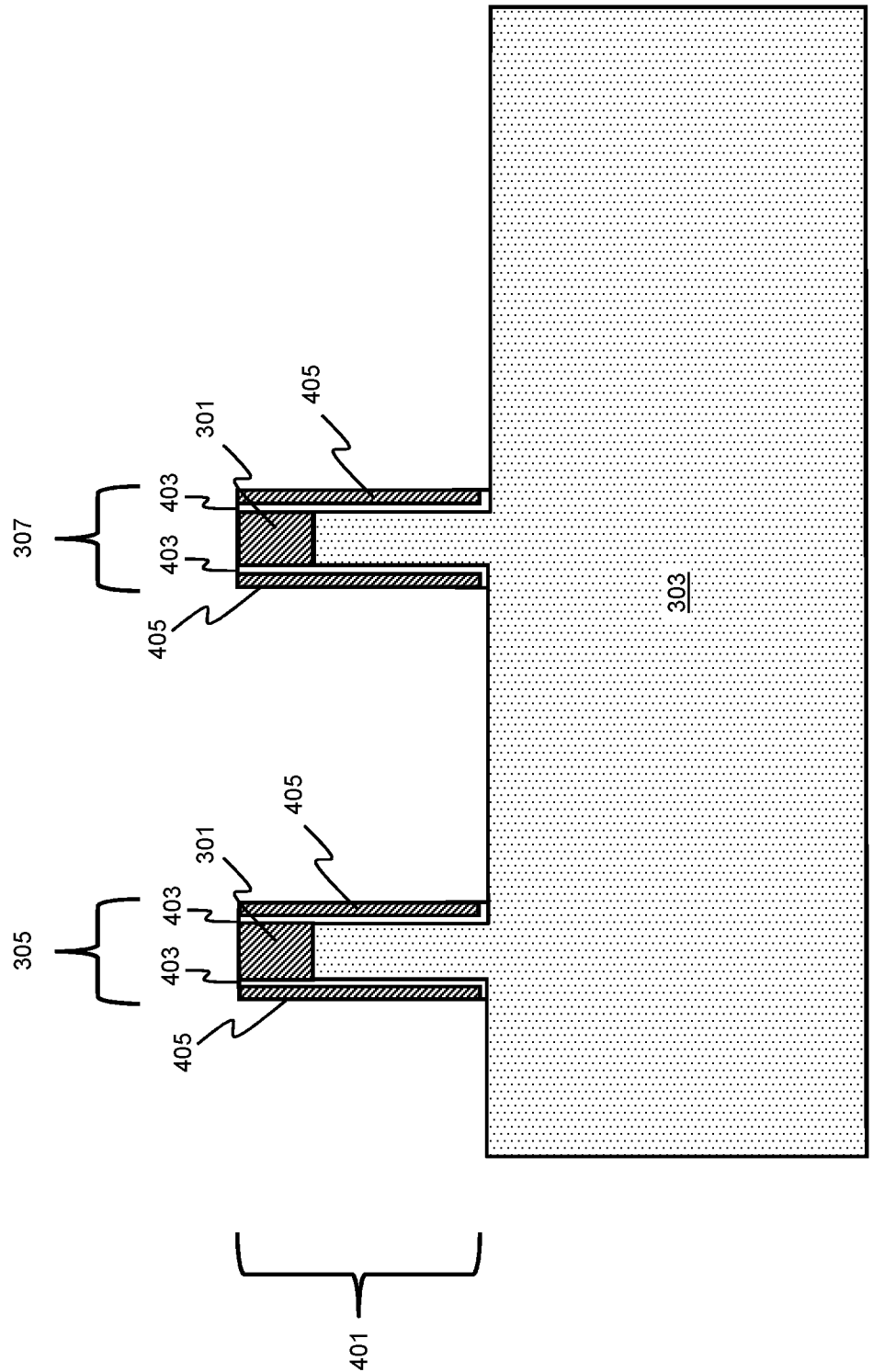
Figure 5:
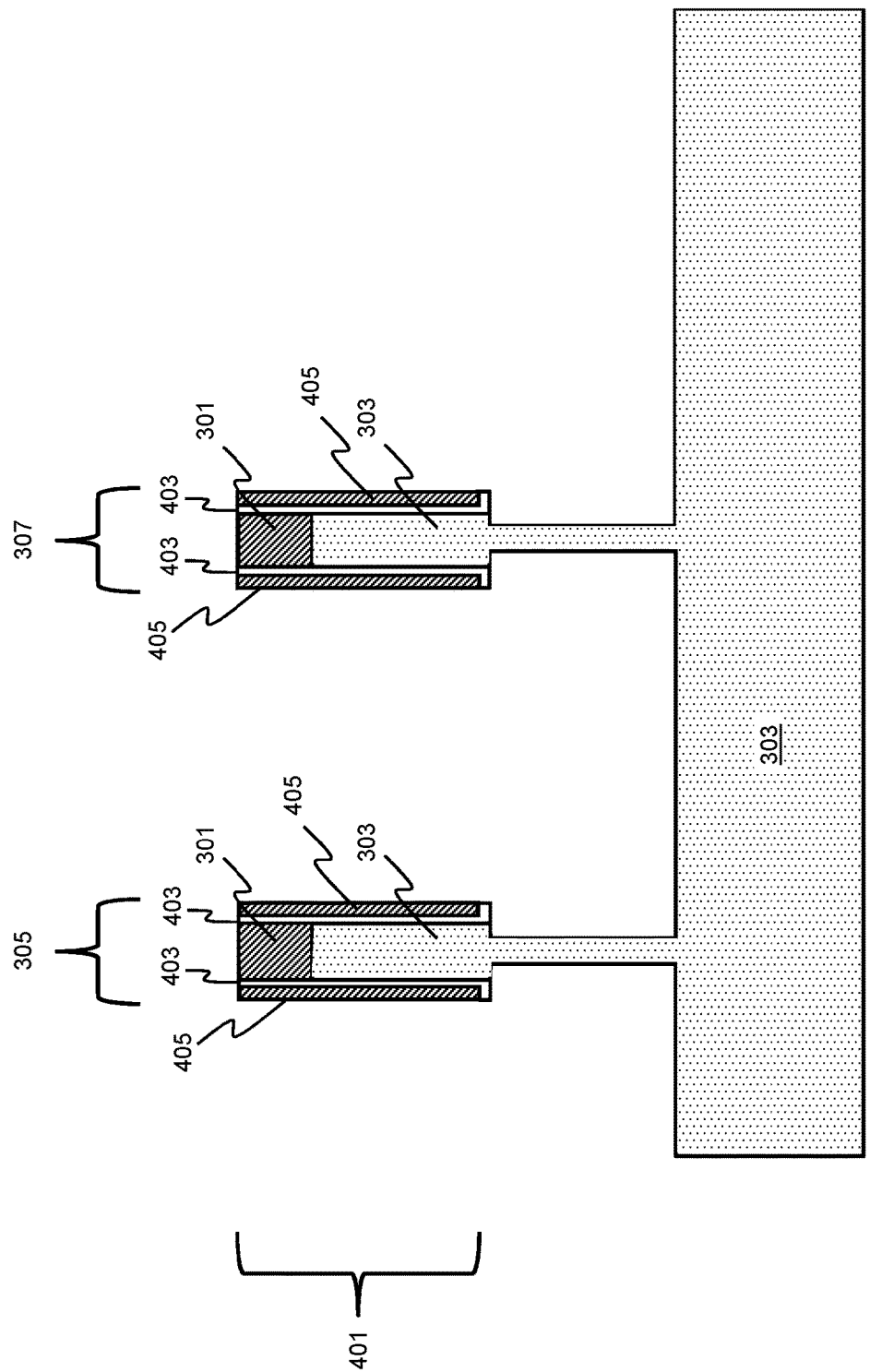

FIGS. 3 through 9, 10A through 15A, 10B through 15B, 16, 17, 18A through 22A, and 18B through 22B schematically illustrate a process flow for forming a sub-fin metal routing layer for a VFET SRAM or logic cell device based on a subtractive fin late bottom S/D process, in accordance with an exemplary embodiment. FIGS. 10B through 15B and 18B through 22B are top views, and FIGS. 10A through 15A and 18A through 22A are cross-sectional views along the lines A-A', respectively. FIGS. 10B through 15B and 18B through 22B are rudimentarily depicted for illustrative purposes and are not complete top views. Adverting to FIG. 3, a hard mask 301 is formed, e.g., of SiN, over a substrate 303. The hard mask 301 and substrate 303 are then etched revealing the active top portion of a pair of fins 305 and 307. A second pair of fins 309 and 311 (not shown for illustrative convenience) is also formed at the same time and in the same manner described in the subsequent steps, except that the second pair of fins is formed laterally separated from the fins 305 and 307, as depicted in FIG. 10B. A bilayer sidewall spacer 401 is formed, e.g., of an oxide layer 403 and a SiN layer 405, on the sidewalls of the hard mask 301 and active top portion of fins 305 and 307, as depicted in FIG. 4. The substrate 303 is then recessed, e.g., 40 nm to 100 nm, revealing the inactive bottom portion of fins 305 and 307, and the inactive bottom portion of fins 305 and 307 is then laterally recessed, e.g., leaving 1 nm to 20 nm in width remaining, as depicted in FIG. 5.

Figure 6:
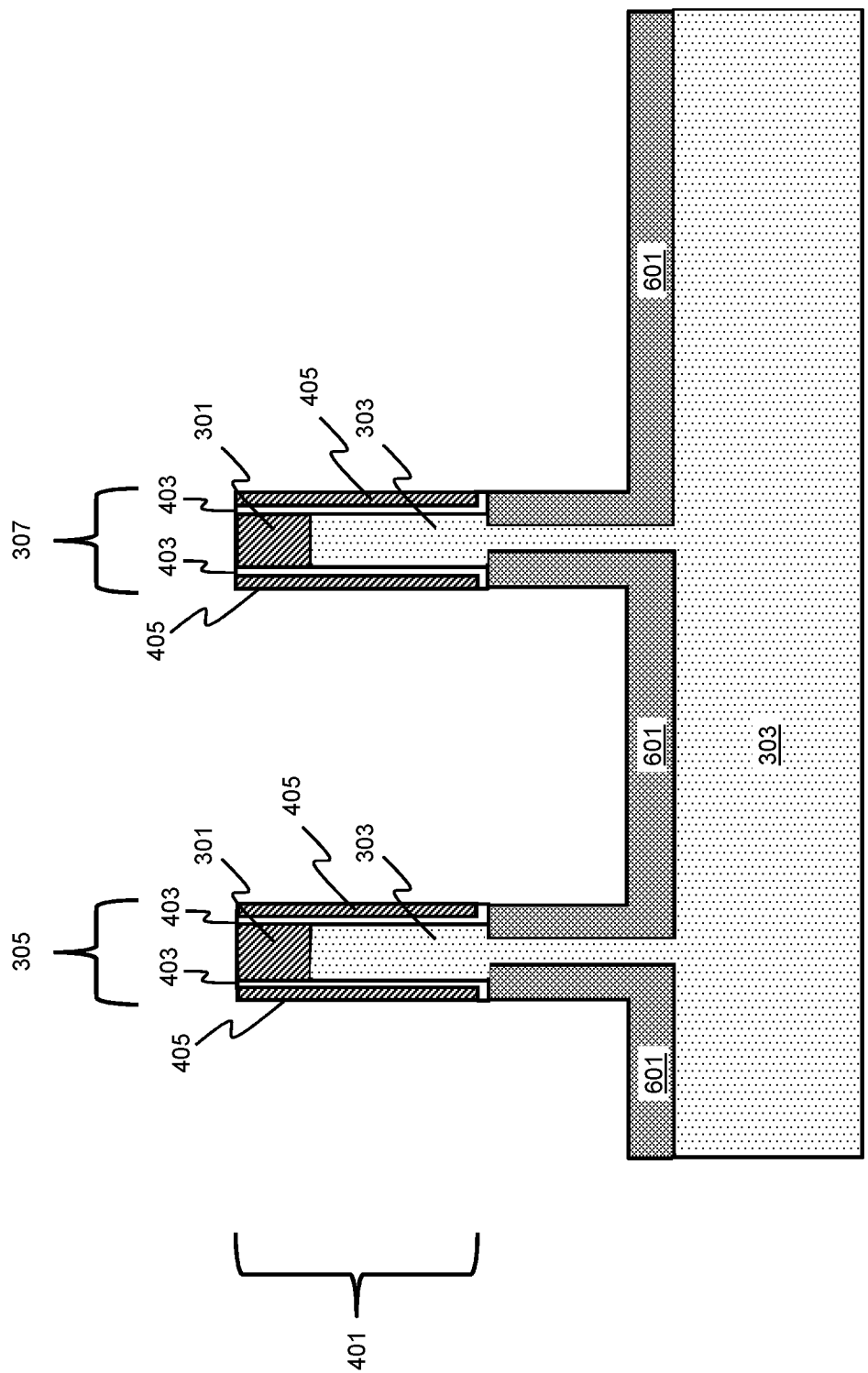
Figure 7:
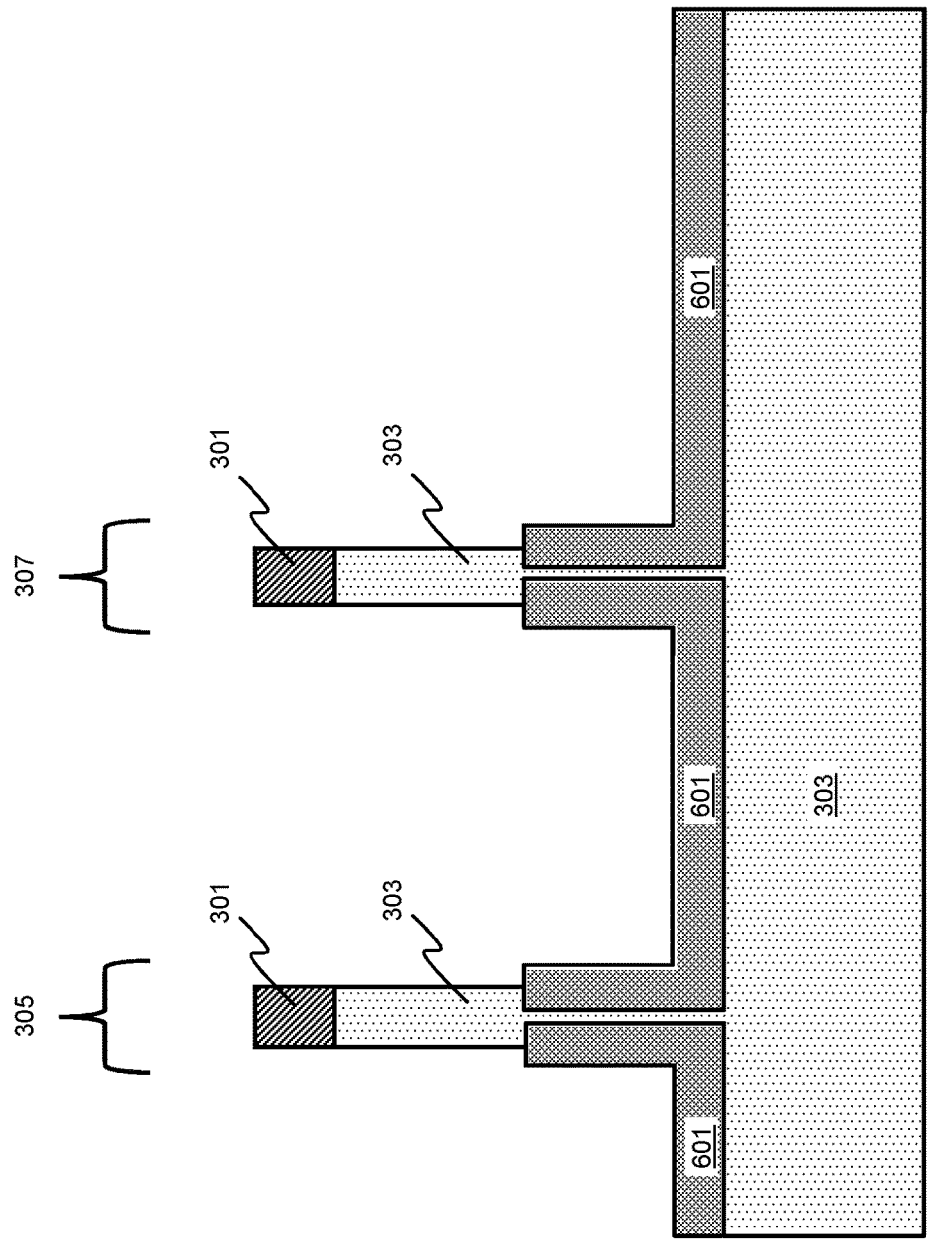
Figure 8:
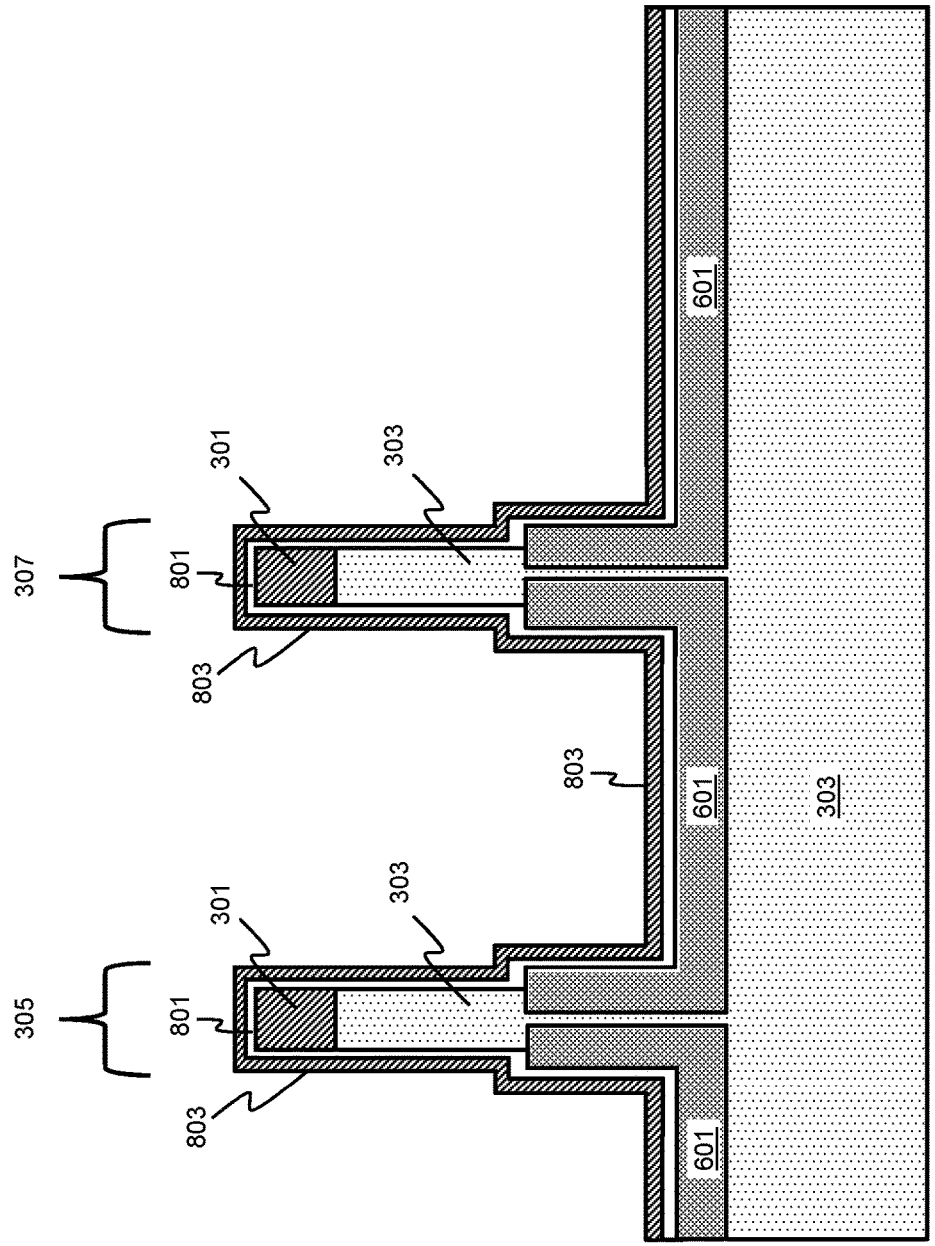

Adverting to FIG. 6, a bottom S/D layer 601 is formed, e.g., to a thickness of 10 nm to 70 nm, by epitaxial growth or via another doping technique, over the substrate 303 and along the sidewalls of the inactive bottom portion of fins 305 and 307. The thickness of the bottom S/D layer 601 is less than the recess depth described in FIG. 5. If the substrate 303 is formed of silicon (Si) or silicon germanium (SiGe), the bottom S/D layer 601 may be formed, e.g., of phosphorous (P) doped Si (Si:P), carbon (C) and P doped Si (Si:CP), boron (B) doped Si (Si:B), B doped SiGe (SiGe:B), arsenic (As) doped Si (Si:As), or the substrate 303 and the bottom S/D layer 601 may be formed of any other semiconductor materials. Next, an anneal process is performed to thermally diffuse the dopant to provide some junction overlap control, and the bilayer sidewall spacer 401 is stripped, as depicted in FIG. 7. One possibility is to include an early silicide at this stage; however, the silicide would need to be able to withstand the front end of line (FEOL) thermal budget. Adverting to FIG. 8, an oxide liner layer 801 and a SiN liner layer 803 are conformally formed, e.g., to a thickness of 0.5 nm to 4 nm and 2 nm to 10 nm, respectively, over the substrate 303. It should be noted that liner layers 801 and 803 could alternatively be conformally formed over the substrate 303 of different materials having similar respective properties as oxide and SiN.

Figure 9:
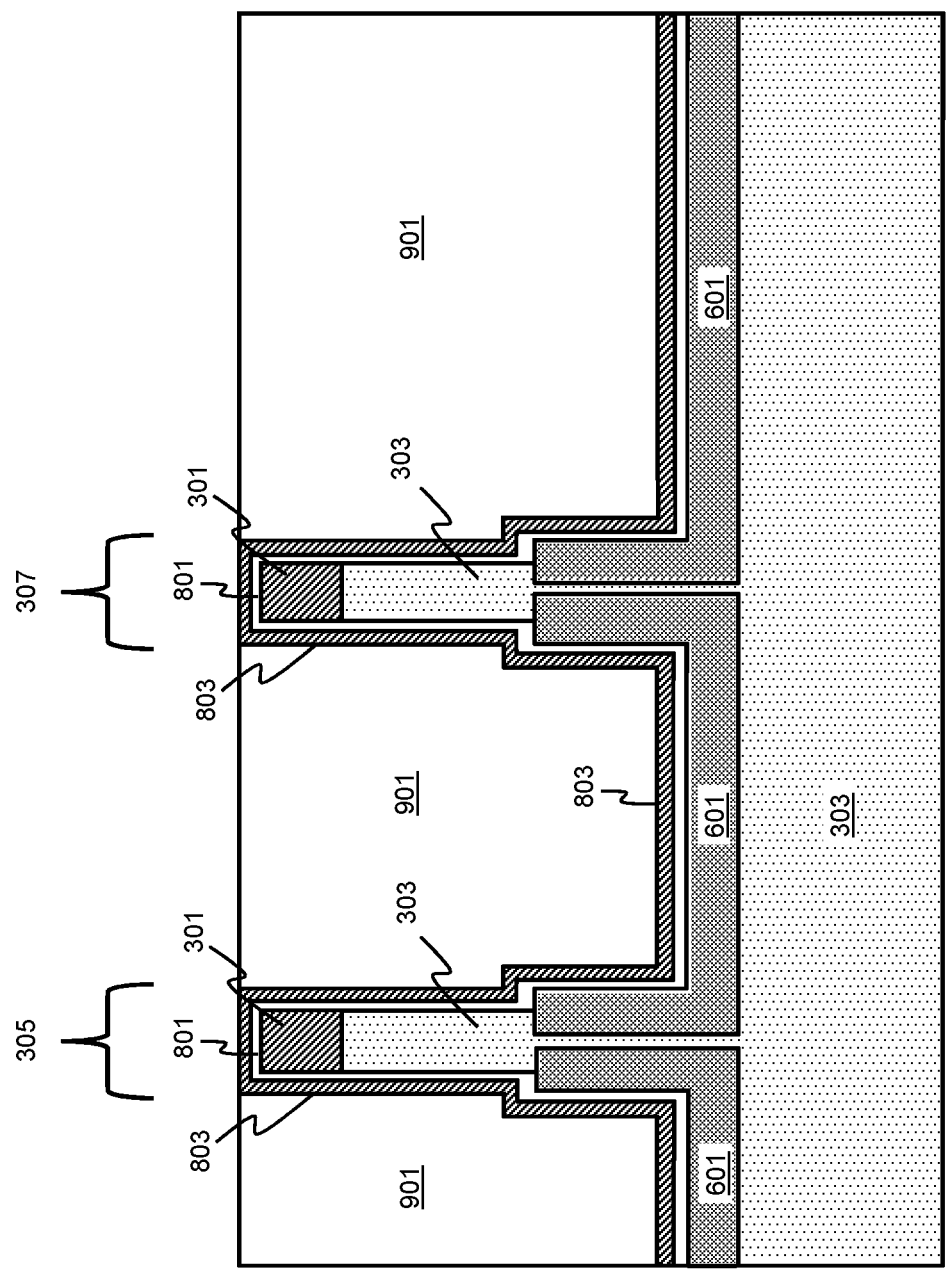
Figure 10B:
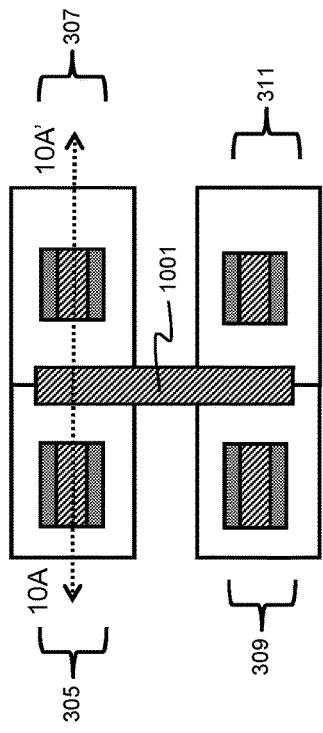
Figure 10A:
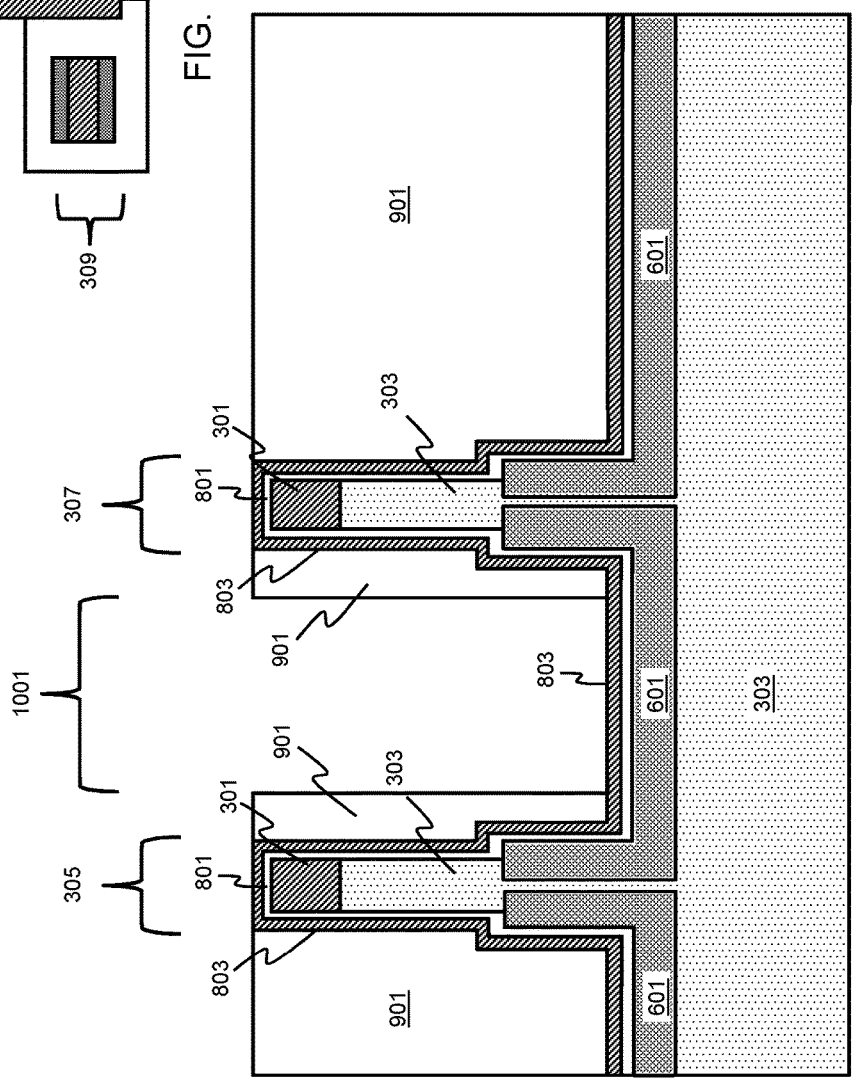

An inter-layer dielectric ILD 901 is then deposited over the substrate 303 and planarized, e.g., by chemical mechanical polishing (CMP), down to the SiN liner layer 803, as depicted in FIG. 9. Alternatively, extra etch stop layers (not shown for illustrative convenience) may also be added if needed by a multistep oxide deposition/recess/SiN deposit process. Adverting to FIGS. 10A and 10B, a trench 1001 is formed, e.g., by anisotropic reactive ion etching (RIE), in the ILD 901 between fins 305 and 307 and fins 309 and 311 down to the SiN liner layer 803. The width of the trench 1001 is set only by fin-fin separation without any other constraints. Adverting to FIGS. 11A and 11B, a portion of the oxide liner layer 801 and the SiN liner layer 803 between the fins 309 and 311 is removed, e.g., by RIE, extending the trench 1001 down to the bottom S/D layer 601, thereby forming a bottom S/D contact area. The bottom S/D contact area may alternatively extend further than just between the fins 309 and 311.

Figures 12A, 12B:
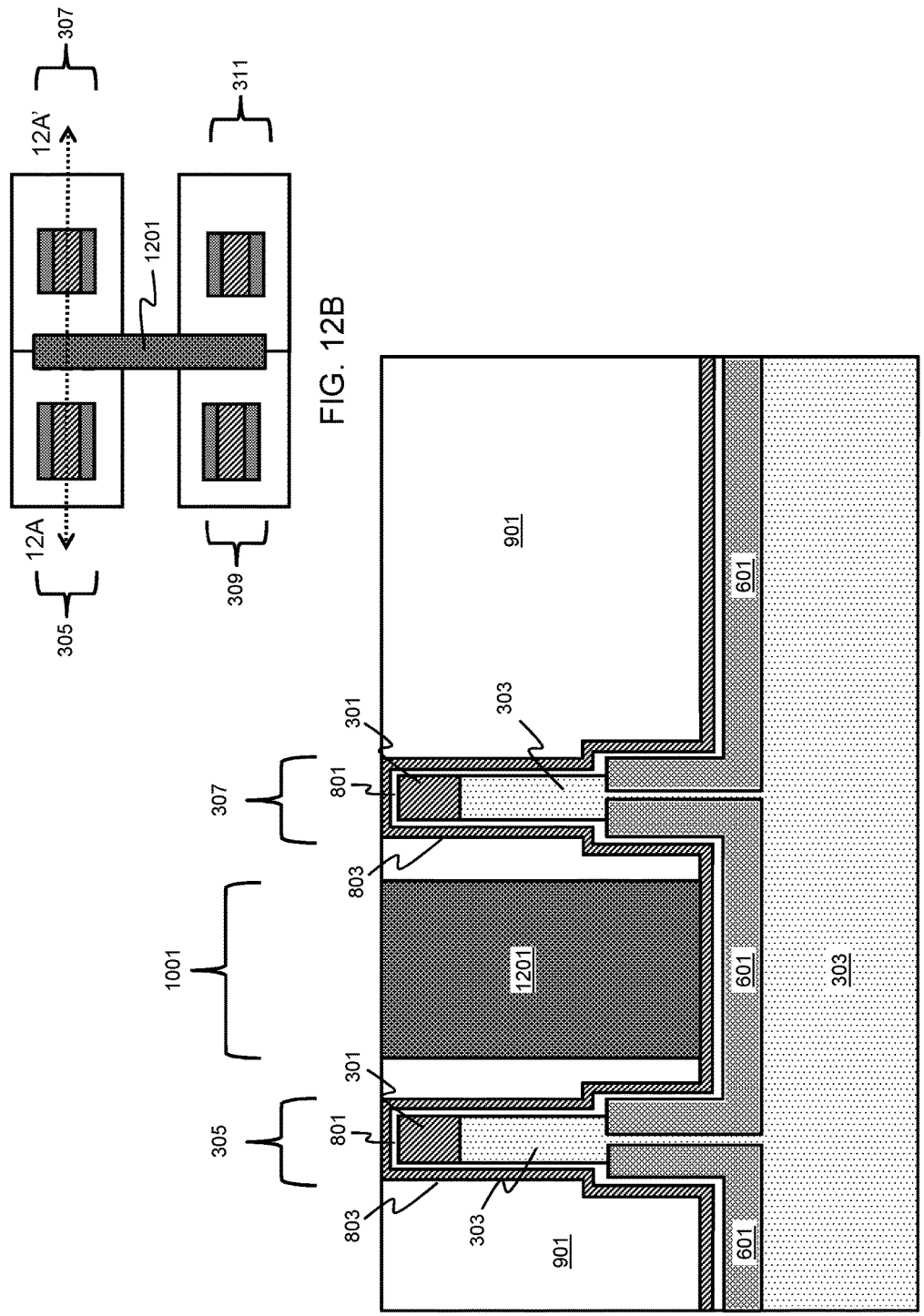
Figure 16:
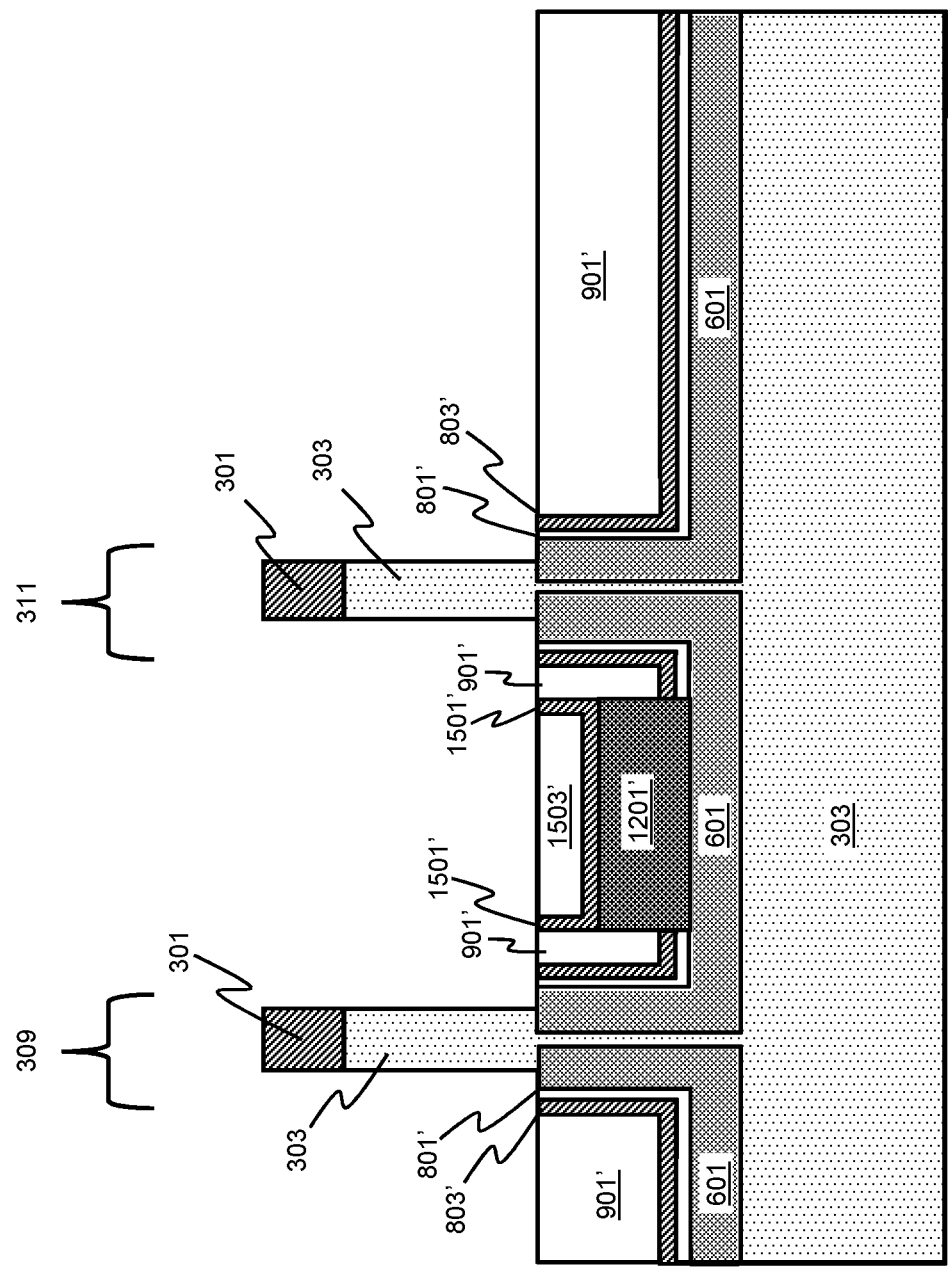

Adverting to FIGS. 12A (cross-sectional view between fins 305 and 307) and 13A (cross-sectional view between fins 309 and 311), a metal routing layer 1201 is formed along the trench 1001. Between the fins 309 and 311, a contact layer (not shown for illustrative convenience), e.g., formed of titanium (Ti) or nickel (Ni), may optionally be used to form a silicide if needed, in conjunction with optional anneal and strip steps followed by a multilayer stack such as titanium nitride (TiN) and tungsten (W) or TiN and aluminum (Al). In the non-contact areas, e.g., between fins 305 and 307, silicide is blocked by the oxide liner layer 801. The metal routing layer 1201 is then recessed until the upper surface is below the active portion of the fins 305 through 311 forming the metal routing layer 1201', as depicted in FIG. 14A. The remaining thickness of the metal routing layer 1201' may be, e.g., 10 nm to 100 nm depending on the dimensions of the fins 305 through 311.

Figure 17:
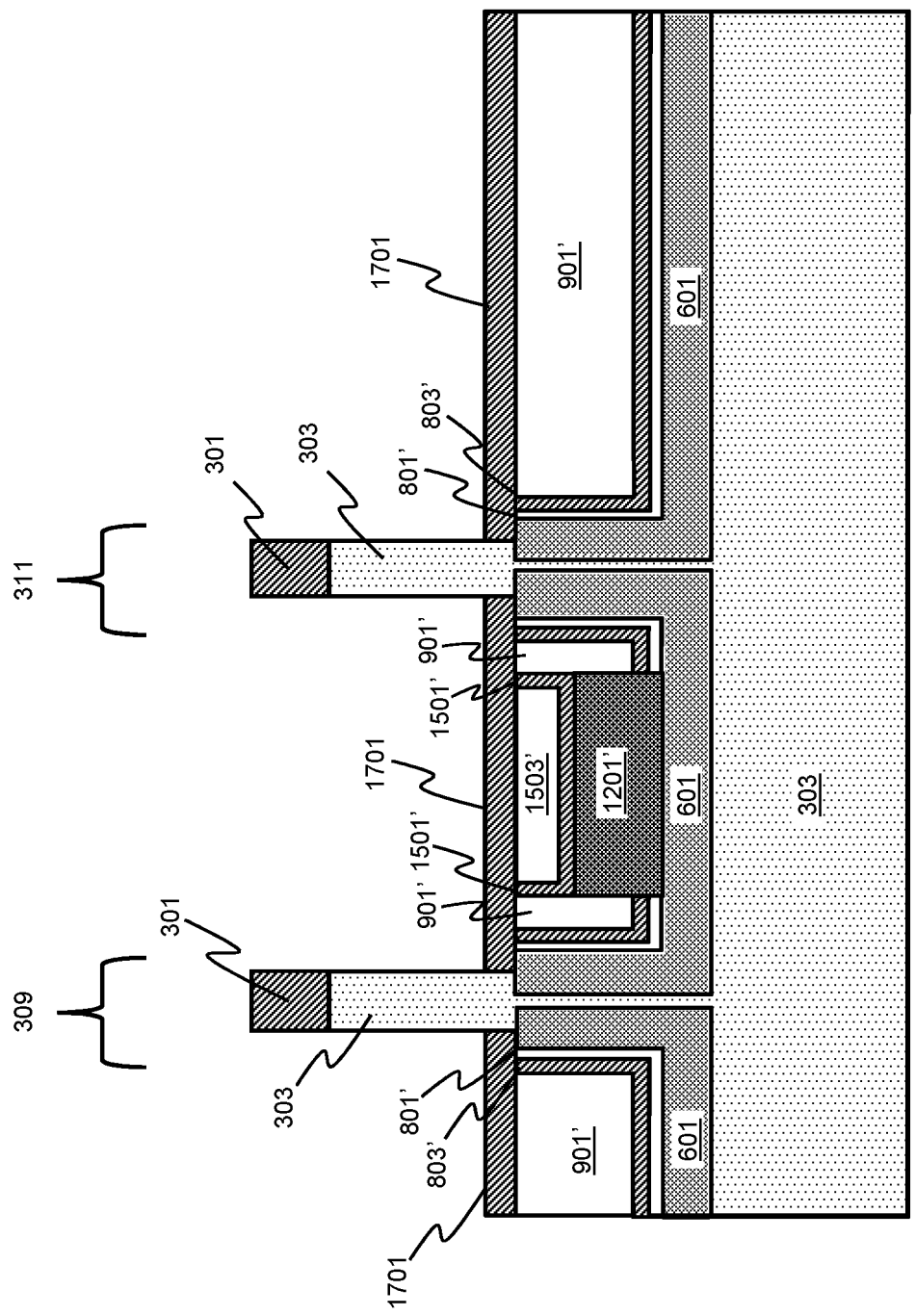

A conformal SiN liner 1501 is then formed, e.g., to a thickness of 2 nm to 10 nm, on the sidewalls of the trench 1001 and on the recessed metal routing layer 1201', as depicted in FIG. 15A. Next, the trench 1001 is filled with an oxide layer 1503, and the oxide layer 1503 is then planarized, e.g., by CMP, down to the SiN layer 803. Adverting to FIG. 16, the oxide layer 1503, the ILD 901, and the SiN liner 1501 are recessed down to the upper surface of the inactive bottom portion of the fins 305 through 311, forming the oxide layer 1503', the ILD 901', and the SiN liner 1501'. The SiN liner layer 803 and the oxide liner layer 801 are then stripped from the active top portions of the fins 305 through 311, forming the SiN liner 1a liner layer 801'. Next, a dielectric layer 1701 is formed, e.g., of SiN, an oxide, or a low-k film such as SiBCN/SiOCN/SiOC, to a thickness of 2 nm to 15 nm, as depicted in FIG. 17.

Adverting to FIGS. 18A (cross-sectional view along the x axis of FIG. 18B) and 19A (cross-sectional view along the y axis of FIG. 19B), a GAA 1801 is formed on the dielectric layer 1701 around each of the fins 305 and 307. A portion of the GAA 1801 may overlap the metal routing layer 1201' as needed. A dielectric layer 1803 similar to the dielectric layer 1701 is then formed over the dielectric layer 1701 and the GAA 1801. Next, an ILD 1805 is formed over the substrate and then planarized, e.g., by CMP, down to the hard mask 301. Thereafter, a bottom contact trench 1807 is formed adjacent to the GAA 1801 through the ILD 1805, the dielectric layer 1803, the dielectric layer 1701, the oxide layer 1503', and the SiN liner 1501' down to the metal routing layer 1201'. The bottom contact trench 1807 is laterally offset such that it overlaps both the GAA 1801 and the metal routing layer 1201' to ensure contact.

Figure 1:
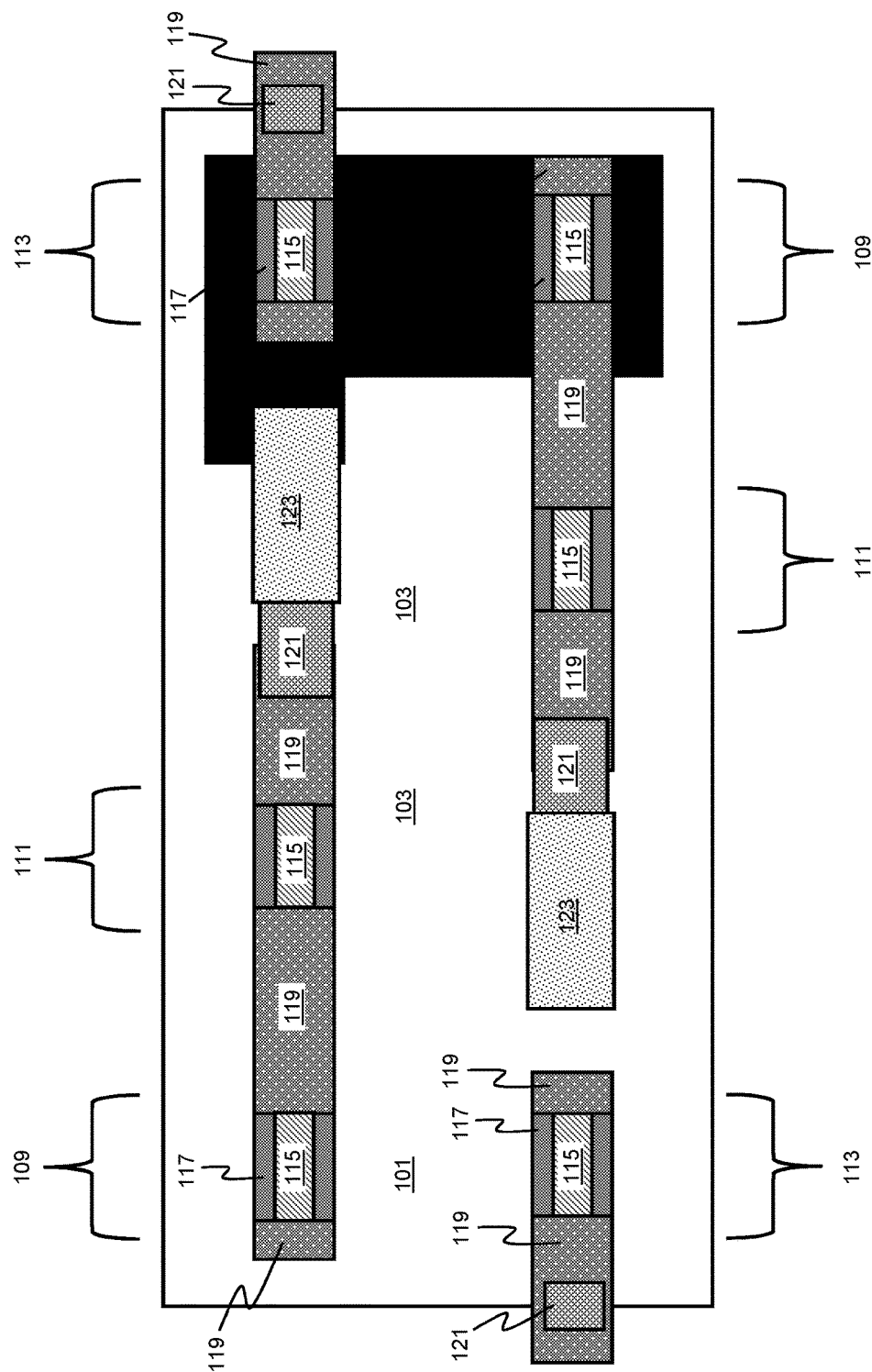
FIG. 1 schematically illustrates a background SRAM design for vertical devices.
Figure 2:
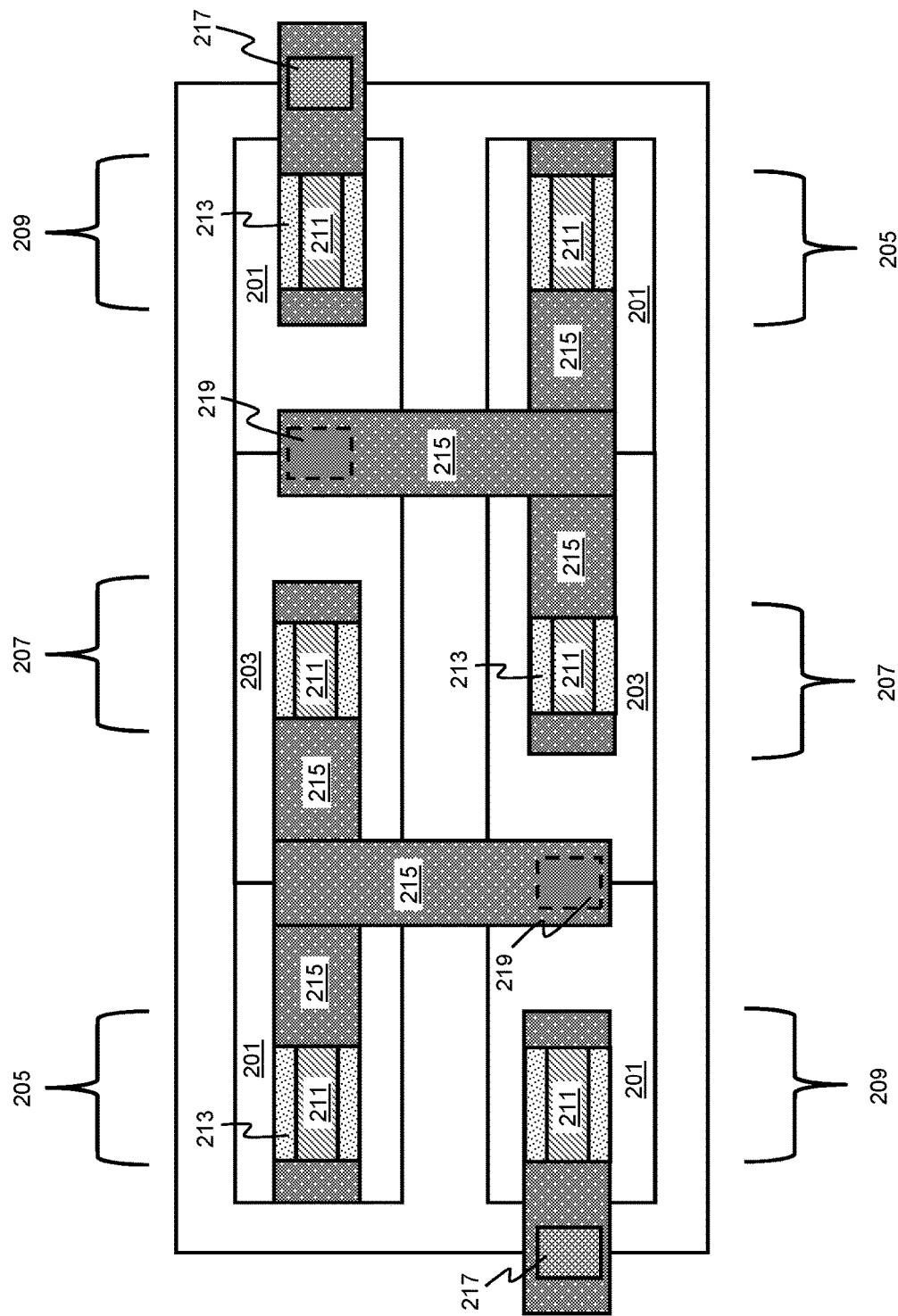
FIG. 2 schematically illustrates a background SRAM design for vertical devices including a bottom n/p S/D cross-couple design.
Figure 20B:
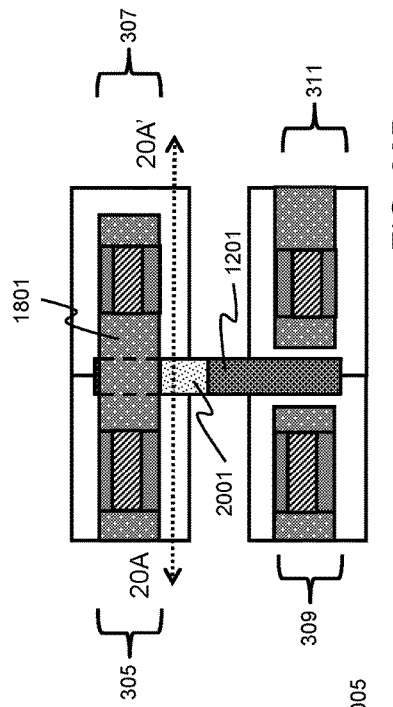
Figure 20A:
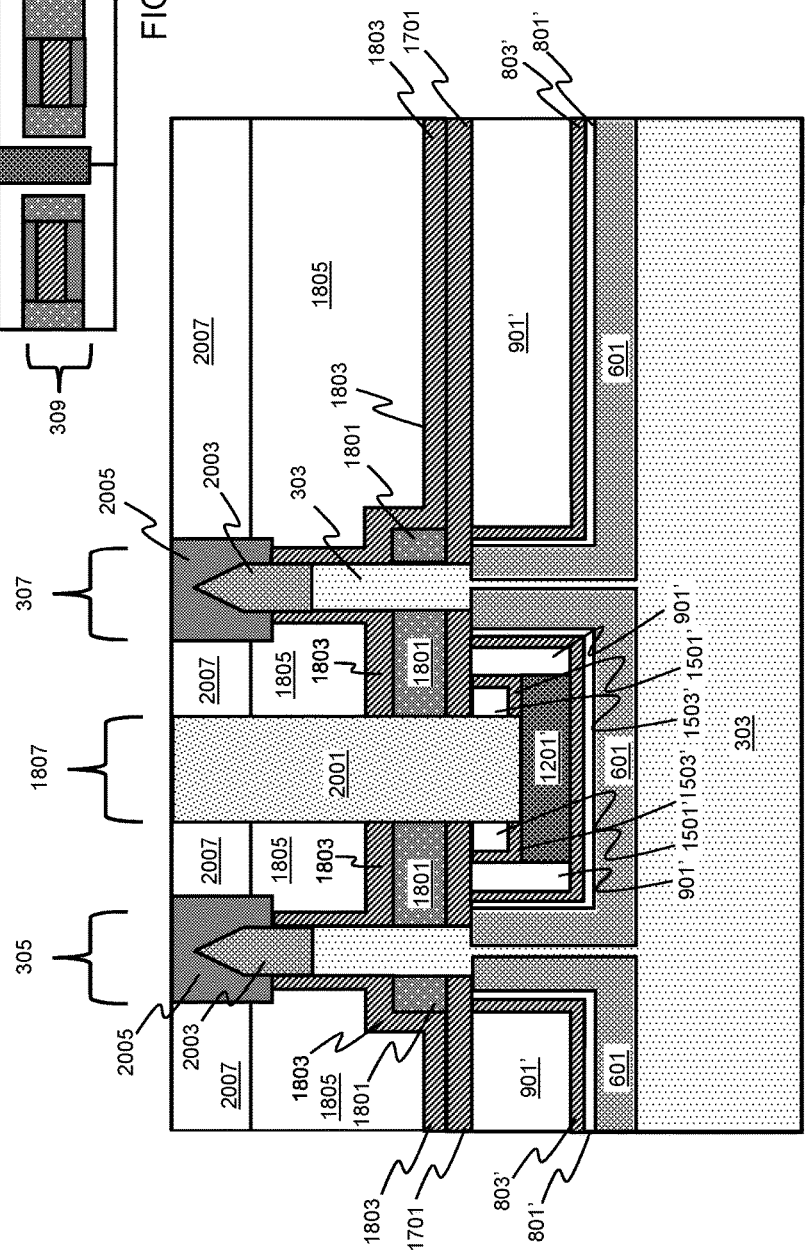

Next, a trench silicide 2001 is formed in the trench 1807 connecting the metal routing layer 1201' and the GAA 1801, as depicted in FIG. 20A (cross-sectional view across the trench silicide 2001 of FIG. 20B), FIG. 21A (cross-sectional view along fins 309 and 311 of FIG. 21B), and FIG. 22A (cross-sectional view along the y axis of FIG. 22B). Thereafter, the process flow follows conventional middle of the line (MOL) formation steps, such as removing the hard mask 301 and forming an upper S/D layer 2003, S/D contacts 2005, and an ILD 2007. Consequently, the area within the circle 2101 in FIG. 21B can be collapsed relative to the known VFET SRAM designs of FIGS. 1 and 2, since the bottom S/D layer 601 can be connected to the metal routing layer 1201' without interfering with the gates 2103 and 2105 of fins 309 and 311, respectively.

Figure 23:
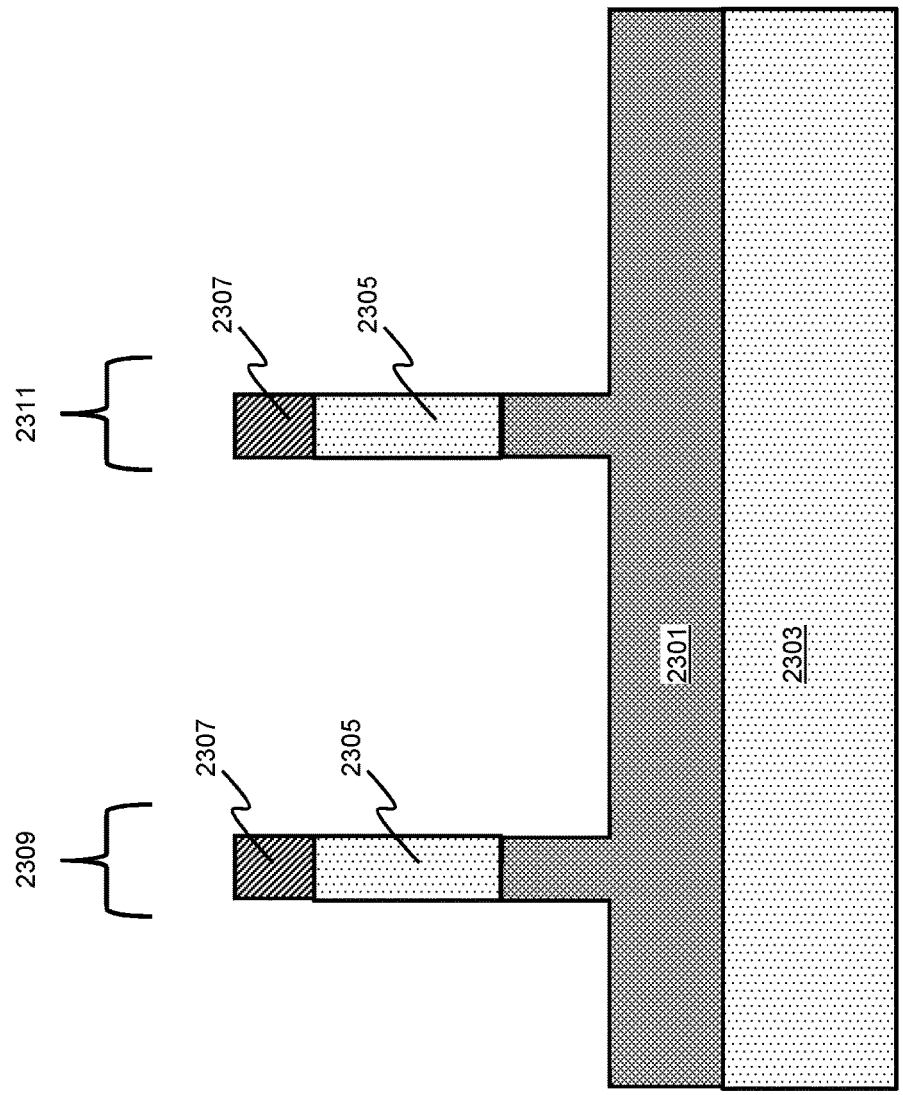
FIGS. 23 through 25 schematically illustrate cross-sectional views of a partial process flow for forming a sub-fin metal routing layer for a VFET SRAM or logic cell device based on a subtractive fin early S/D process, in accordance with exemplary embodiment.
Figure 24:
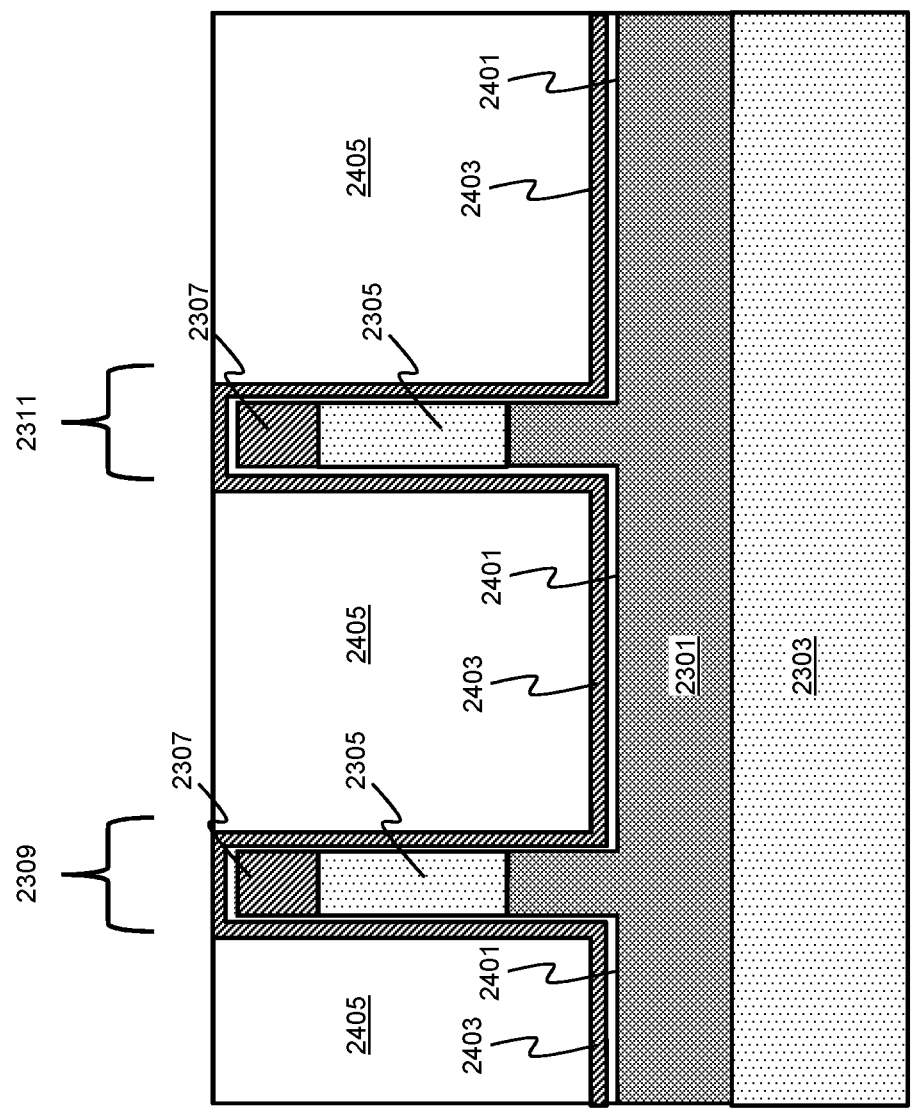
Figure 25:
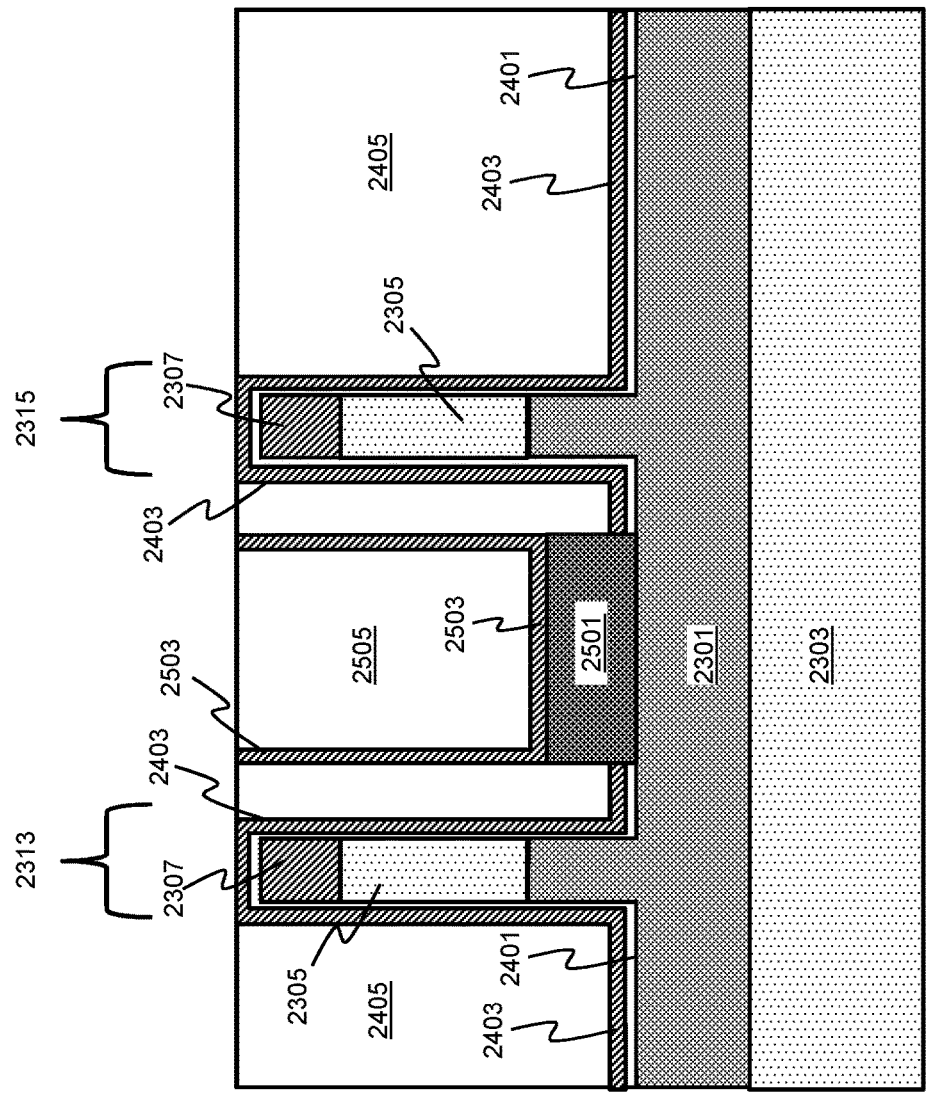

FIGS. 23 through 25 (cross-sectional views) schematically illustrate a partial process flow for forming a sub-fin metal routing layer for either a VFET SRAM logic cell device based on a subtractive fin early S/D process, in accordance with an exemplary embodiment. Adverting to FIG. 23, a doped bottom S/D layer 2301 is formed over the substrate 2303 in the same manner as the bottom S/D layer 601 of FIG. 6. An active fin layer 2305 is then formed, e.g., of Si, over the bottom S/D layer 2301, and a hard mask 2307 is formed over the active fin layer 2305. The hard mask 2307 is then patterned and the active fin layer 2305 is etched down to the bottom S/D layer 2301 on each side of the patterned hard mask 2307, revealing the active top portion of fins 2309 and 2311. Thereafter, the bottom S/D layer 2301 is recessed around the active top portion of fins 2309 and 2311, revealing the inactive bottom portion of fins 2309 and 2311. As described in FIG. 3, a second pair of fins 2313 and 2315 (not shown for illustrative convenience) is also formed at the same time and in the same manner, except that the second pair of fins 2313 and 2315 is formed laterally separated from the fins 2309 and 2311, as depicted in FIG. 10B.

Adverting to FIG. 24, an oxide liner layer 2401 and a SiN liner layer 2403 are conformally formed over the substrate 2303, e.g., to a thickness of 0.5 nm to 4 nm and 2 nm to 10 nm, respectively. An ILD 2405 is then deposited over the substrate and planarized, e.g., by CMP, down to the SiN liner layer 2403. As described in FIG. 12, a metal routing layer 2501 is formed on the SiN liner layer 2403 between fins 2309 and 23011 and on the bottom S/D layer 2301 at least between fins 2313 and 2315, as depicted in FIG. 25. A SiN liner 2503 is formed along the sidewalls of the IDL 2405 and on the metal routing layer 2501. Thereafter, an oxide layer 2505 is formed over the SiN layer 2503 and planarized, e.g., by CMP, down to the SiN liner layer 2403. The process flow then continues as described in detail in FIGS. 16, 17, 18A through 22A, and 18B through 22B. Again, it should be noted that liner layers 2401 and 2403 could alternatively be conformally formed over the substrate 2303 of different materials with similar respective properties as oxide and SiN.

FIGS. 26A through 29A and 26B and 29B schematically illustrate a process flow for forming a sub-fin metal routing layer for a VFET SRAM or logic cell device capable of increased CPP scaling based on a subtractive fin late bottom S/D process, in accordance with another exemplary embodiment. FIGS. 26B through 29B are top views, and FIGS. 26A through 29A are cross-sectional views along the lines A-A', respectively. FIGS. 26B through 29B are rudimentarily depicted for illustrative purposes and are not complete top views. Adverting to FIGS. 26A (cross-sectional view along the x axis of FIG. 26B) and 27A (cross-sectional view along the y axis of FIG. 27B), the process flow preceding FIGS. 26A and 26B and 27A and 27B is substantially the same as described in FIGS. 3 through 9, 10A through 15A, 10B through 15B, 16, and 17. However, rather than forming a bottom S/D contact trench 1807 adjacent to the GAA 1801, a dedicated opening 2601 is formed using a unique patterning step through the ILD 1805, the dielectric layer 1803, the GAA 1801, the dielectric layer 1701, the oxide layer 1503', and the SiN liner 1501' down to the metal routing layer 1201' to enable the subsequent formation of a dedicated xc layer, e.g., using a separate lithographic exposure.

Figure 28B:
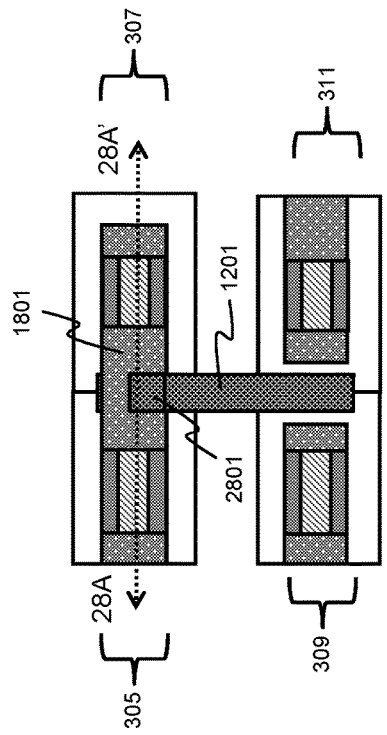
Figure 28A:
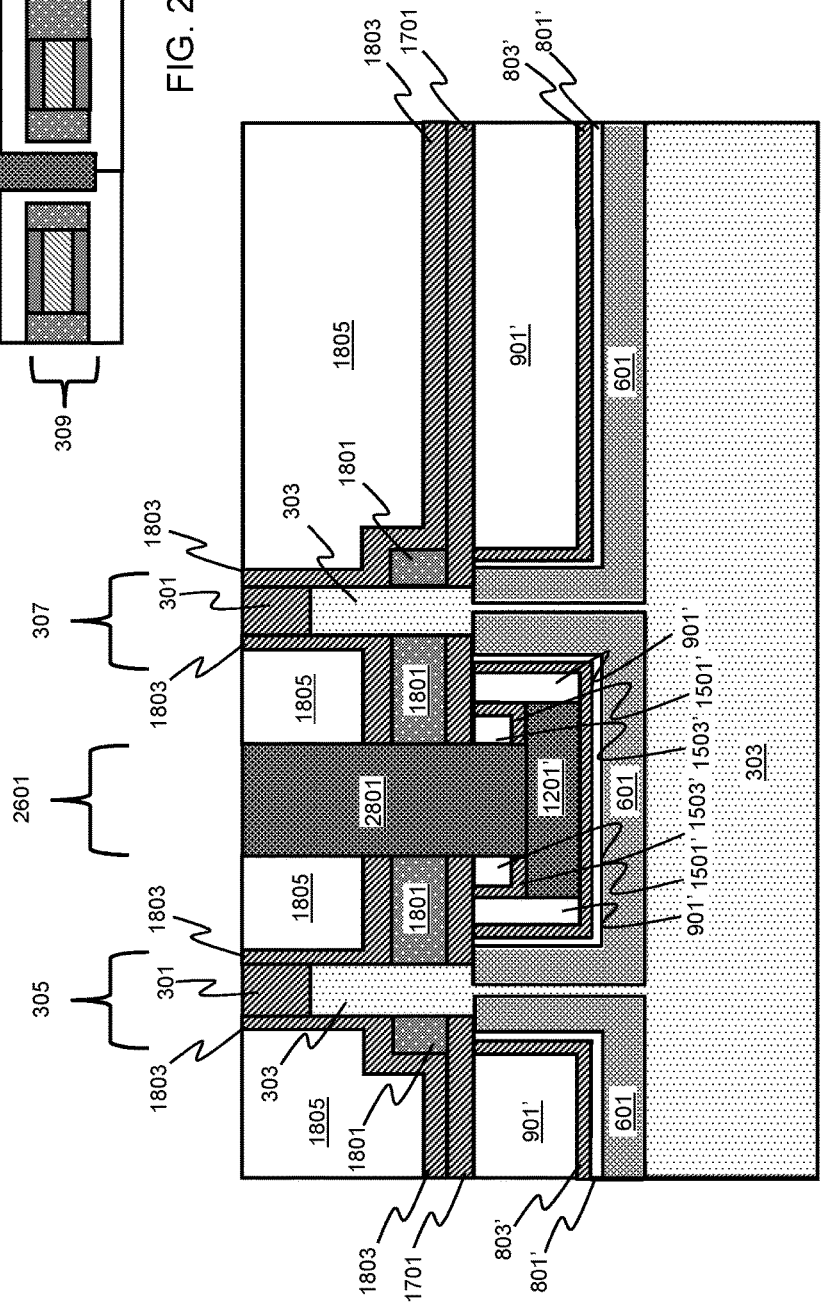
Figure 30:
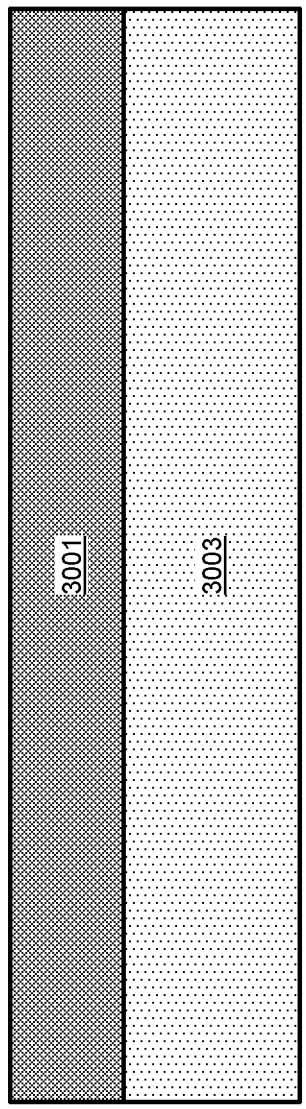
FIGS. 30 through 36 schematically illustrate cross-sectional views of a process flow for forming a sub-fin metal routing layer for a VFET SRAM or logic cell device based on a channel-last replacement fin early bottom S/D process, in accordance with another exemplary embodiment.

Adverting to FIGS. 28A and 28B, the opening 2601 is filled with a metal layer 2801, e.g., W, Al, etc. The metal layer 2801 is then recessed down to the upper surface of the GAA 1801 forming the dedicated xc 1a, as depicted in FIG. 29A. The dedicated xc layer 2801' connects the bottom S/D layer 601 between the fins 309 and 311 to the GAA 1801 between the fins 305 and 307. Thereafter, a dielectric layer 2901 is formed over the dedicated xc 1a, and the process flow again follows conventional MOL formation steps, such as removing the hard mask 301 and forming an upper S/D layer 2903, S/D contacts 2905, and an ILD 2907. The cross-sectional view along the x axis between fins 309 and 311 is the same as the cross-sectional view along the x axis in FIG. 21A. Consequently, the dedicated xc layer 2801', unlike the existing trench silicide xc layer 2001, enables maximum CPP scaling.

Figure 31:
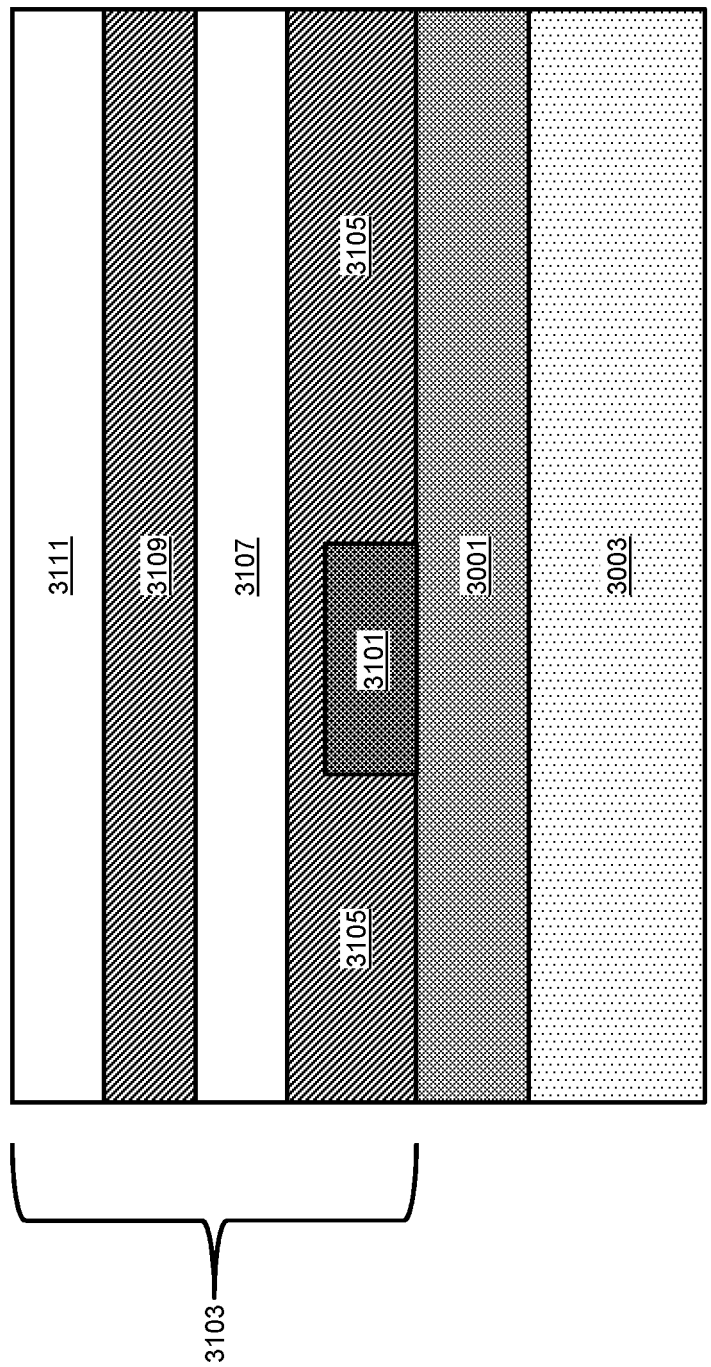
Figure 32:
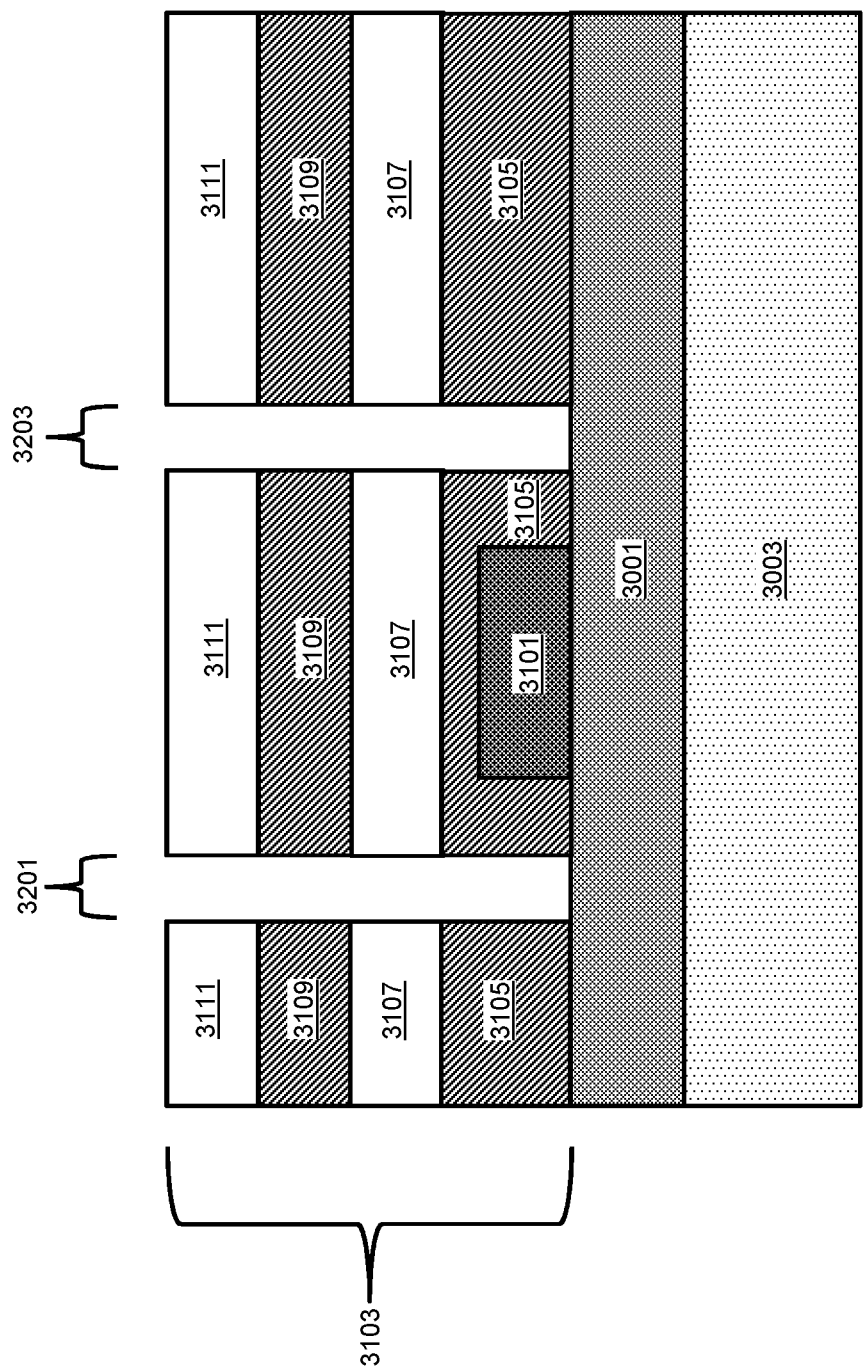

FIGS. 30 through 36 (cross sectional views) schematically illustrate a process flow for forming a sub-fin metal routing layer for a VFET SRAM or logic cell device based on a channel-last replacement fin early bottom S/D process, in accordance with another exemplary embodiment. Adverting to FIG. 30, a n+/p+ doped bottom S/D layer 3001 is formed, e.g., to a thickness of 5 nm to 50 nm, over a substrate 3003. A blanket dielectric layer (not shown for illustrative convenience) is then formed over the bottom S/D layer 3001. In the same way that the oxide liner layer 801 and the SiN liner layer 803 were removed down to the bottom S/D layer 601, thereby forming a bottom S/D contact area in FIGS. 11A and 11B, the dielectric layer is etched in the designed contact areas. Thereafter, a metal layer (not shown for illustrative convenience) is formed over the dielectric layer in the non-contact areas and the bottom S/D layer 3001 in the contact areas and then patterned forming the metal routing layer 3101, as depicted in FIG. 31. The metal routing layer 3101 may be formed of the same metal as the metal routing layer 1201' and may be patterned, e.g., to a width of 3 nm to 50 nm, depending on the intended circuit design.

Figure 33:
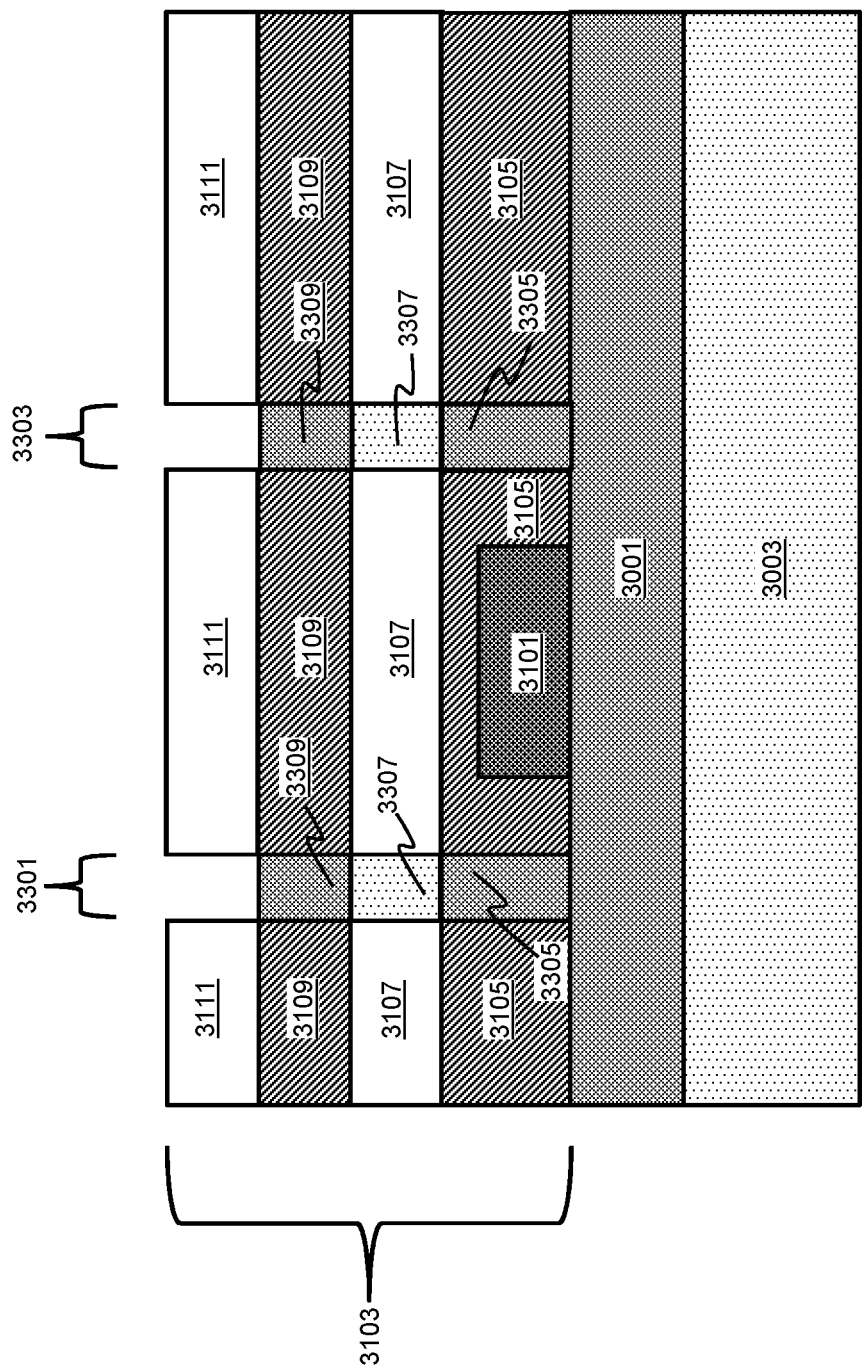
Figure 34:
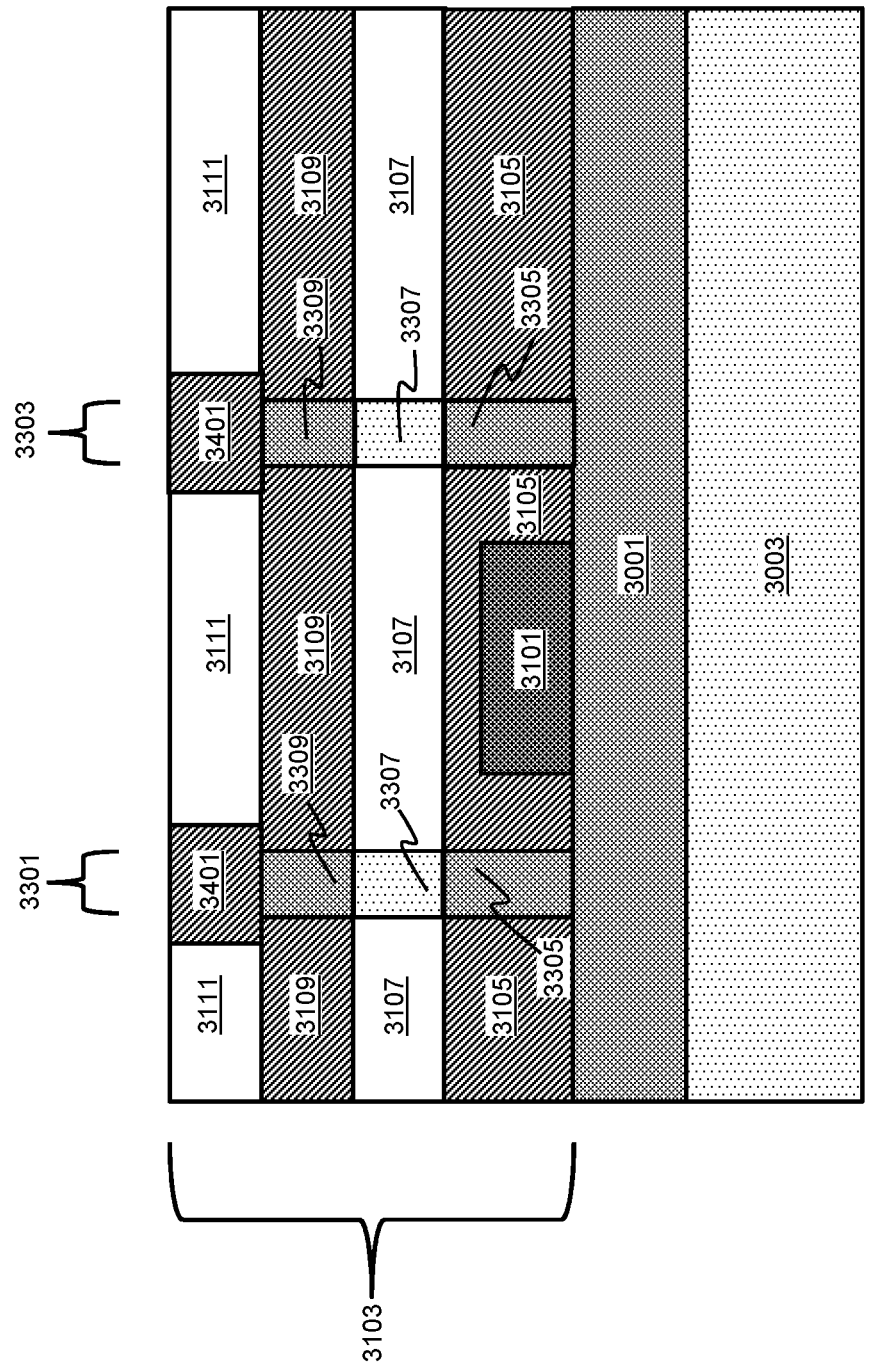

Next, a FEOL ILD RMG stack 3103 is formed over the metal routing layer 3101 and the dielectric layer. The RMG stack 3103 includes a SiBCN layer 3105, an oxide layer 3107, a SiBCN layer 3109, and an oxide layer 3111. Alternatively, the SiBCN layer 3105 may be formed, e.g., of SiOC, SiOCN, SiC, or the like. Adverting to FIG. 32, replacement fin trenches 3201 and 3203 are formed through the RMG stack 3103 down to the bottom S/D layer 3001. Replacement fin stacks 3301 and 3303 are then formed by forming an optional bottom S/D layer 3305 on the bottom S/D layer 3001 in the replacement fin trenches 3201 and 3203, forming an active fin layer 3307 on the bottom S/D layer 3305, and forming a top S/D layer 3309 on the active fin layer 3307, as depicted in FIG. 33. The replacement fin stacks 3301 and 3303 may be doped or undoped. SiN caps 3401, having a width wider than the replacement fin stacks 3301 and 3303, are then formed over the replacement fin stacks 3301 and 3303, as depicted in FIG. 34.

Figure 35:
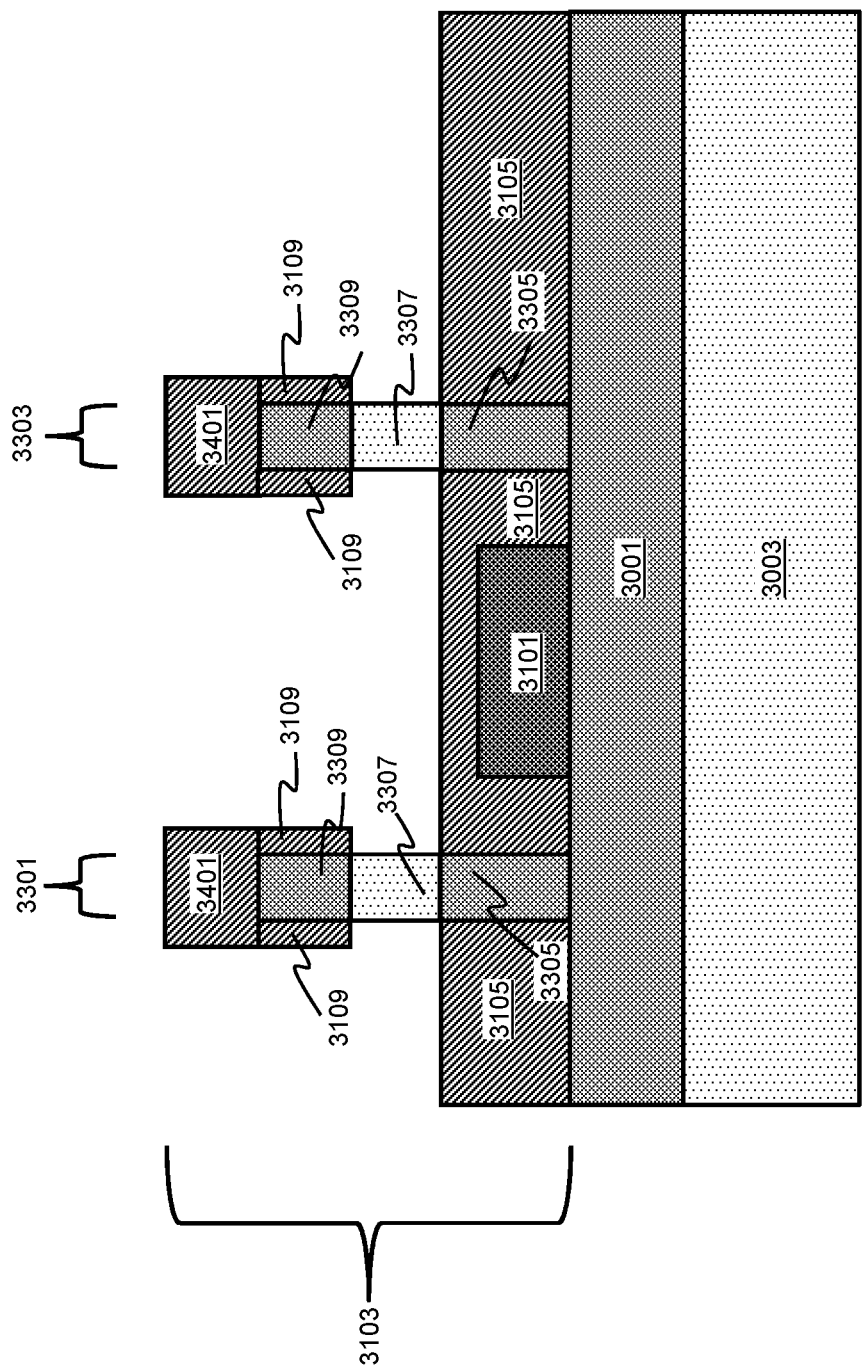
Figure 36:
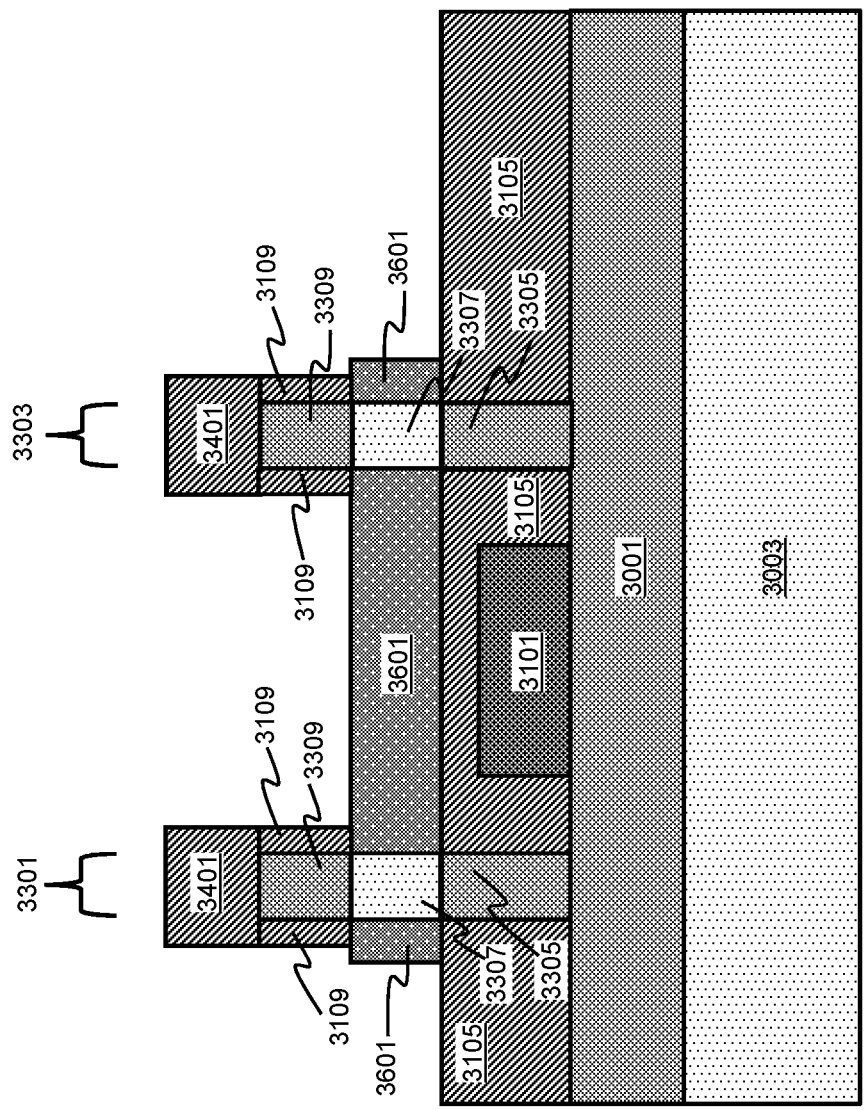

Adverting to FIG. 35, a portion of the RMG stack 3103 is removed by etching the RMG stack 3103 down to the SiBCN layer 3105 on each side of the SiN caps 3401 with a portion of the SiBCN layer 3019 remaining under the SiN caps 3401. A GAA 3601 is then formed on the SiBCN layer 3105 around each of the replacement fin stacks 3301 and 3303, as depicted in FIG. 36. Next, either a trench silicide (not shown for illustrative convenience) is formed adjacent to the GAA 3601 on the metal routing layer 3101, thereby connecting the metal routing layer 3101 and the GAA 3601, as depicted in FIG. 20A and FIG. 20B, or a dedicated xc layer (not shown for illustrative convenience) is formed through the GAA 3601 down to the metal routing layer 3101, thereby connecting the metal routing layer 3101 and the GAA 3601, as depicted in FIGS. 29A and 29B.

Alternatively, a FEOL ILD RMG stack may be formed by forming a SiN layer (not shown for illustrative convenience) over the metal routing layer 3101 and the dielectric layer; planarizing the SiN layer down to the metal routing layer 3101; forming a second SiN layer (not shown for illustrative convenience) over the first SiN layer; forming an oxide layer (not show for illustrative convenience) over the second SiN layer; and forming a third SiN layer (not shown for illustrative convenience) over the oxide layer. Thereafter, a portion of the alternatively formed RMG stack is removed by etching the RMG stack down to the second SiN layer on each side of the SiN cap, a portion of the third SiN layer remaining under the SiN cap.

The embodiments of the present disclosure can achieve several technical effects including reducing the space constraints on xc contact, through the use of a bottom S/D contact interconnect, and enabling increased CPP scaling, through the use of a dedicated xc layer. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in any IC devices with VFETs or logic cells.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a source/drain (S/D) layer over a substrate;
   forming a blanket dielectric layer over the S/D layer;
   forming a metal routing layer over the blanket dielectric layer;
   patterning the metal routing layer;
   forming a replacement metal gate (RMG) stack over the S/D layer and the metal routing layer;
   forming a replacement fin trench through the RMG stack down to the S/D layer;
   forming a replacement fin stack in the replacement fin trench;
   forming a silicon nitride (SiN) cap over the replacement fin wider than the replacement fin;
   removing a portion of the RMG stack on each side of the SiN cap; and
   forming a gate all around (GAA) on a remaining portion of the RMG stack and around the replacement fin.

2. The method according to claim 1, comprising forming the S/D layer to a thickness of 5 nanometer (nm) to 50 nm.

3. The method according to claim 1, further comprising etching the blanket dielectric layer down to the S/D layer in designed contact areas prior to forming the metal routing layer.

4. The method according to claim 1, comprising patterning the metal routing layer to a width of 3 nm to 50 nm.

5. The method according to claim 1, comprising forming the RMG stack by:
   forming a first silicon boron carbon nitride (SiBCN), silicon oxycarbide (SiOC), silicon oxycarbonitride (SiOCN), or silicon carbide (SiC) layer over the S/D layer and the metal routing layer;
   forming a first oxide layer over the first SiBCN, SiOC, SiOCN, or SiC layer;
   forming a second SiBCN, SiOC, SiOCN, or SiC layer over the first oxide layer; and
   forming a second oxide layer over the second SiBCN, SiOC, SiOCN, or SiC layer.

6. The method according to claim 5, comprising removing the portion of the RMG stack by:
   etching the RMG stack down to the first SiBCN, SiOC, SiOCN, or SiC layer on each side of the SiN cap and a portion of the second SiBCN, SiOC, SiOCN, or SiC layer remaining under the SiN cap.

7. The method according to claim 1, comprising forming the RMG stack by:
   forming a first SiN layer over the S/D layer and the metal routing layer;
   planarizing the first SiN layer down to the metal routing layer;
   forming a second SiN layer over the first SiN layer and the metal routing layer;
   forming an oxide layer over the second SiN layer; and
   forming a third SiN layer over the oxide layer.

8. The method according to claim 7, comprising removing the portion of the RMG stack by:
   etching the RMG stack down to the second SiN layer on each side of the SiN cap, a portion of the third SiN layer remaining under the SiN cap.

9. The method according to claim 1, comprising forming the replacement fin stack by:
   forming a second S/D layer on the S/D layer in the replacement fin trench;
   forming an active fin layer on the second S/D layer; and
   forming a third S/D layer on the active fin layer.

10. The method according to claim 1, comprising forming the replacement fin stack by:
    forming an active fin layer on the S/D layer in the replacement fin trench; and
    forming a second S/D layer on the active fin layer.

11. The method according to claim 1, further comprising forming a trench silicide adjacent to the GAA on the metal routing layer to connect the GAA and the metal routing layer.

12. The method according to claim 1, further comprising forming a dedicated cross-couple (xc) contact through the GAA down to the metal routing layer to connect the GAA and the metal routing layer.

13. A device comprising:
    a source/drain (S/D) layer over a substrate;
    a metal routing layer over a portion of the S/D layer;
    a first fin stack and a second fin stack over respective portions of the S/D layer, each fin stack on an opposite side of the metal routing layer;
    a silicon boron carbon nitride (SiBCN) layer or a silicon nitride (SiN) layer over the S/D layer and the metal routing layer;
    a gate all around (GAA) over the metal routing layer, a portion of the SiBCN layer or the SiN layer, and around each fin stack;
    a second SiBCN layer or a second SiN layer around each fin stack and over a portion of the GAA; and
    a silicon nitride (SiN) cap over each fin stack and the SiBCN layer or the SiN layer.

14. The device according to claim 13, wherein the SiBCN layer is formed over the S/D layer and the metal routing layer, the device comprising:
    the second SiBCN around each fin stack.

15. The device according to claim 13, wherein the SiN layer is formed over the S/D layer and the metal routing layer, the device comprising:
    the second SiN layer around each fin stack.

16. The device according to claim 13, further comprising:
    a dielectric layer over non-contact areas of the S/D layer and under portions of the metal routing layer.

17. The device according to claim 13 wherein the metal routing layer comprises a width of 3 nm to 50 nm.

18. The device according to claim 13, further comprising:
    a trench silicide adjacent to the GAA on the metal routing layer to connect the GAA and the metal routing layer.

19. The device according to claim 13, further comprising:
    a dedicated cross-couple (xc) contact through the GAA down to the metal routing layer to connect the GAA and the metal routing layer.

20. A method comprising:
    forming a n+/p+ doped source/drain (S/D) layer to a thickness of 5 nanometer (nm) to 50 nm over a substrate;
    forming a blanket dielectric layer over the S/D layer;
    etching the blanket dielectric layer down to the S/D layer in designed contact areas;
    forming a metal routing layer over the blanket dielectric layer and the S/D layer;
    patterning the metal routing layer to a width of 3 nm to 50 nm;
    forming a replacement metal gate (RMG) stack over the S/D layer and the metal routing layer;
    forming a replacement fin trench through the RMG stack down to the S/D layer;
    forming a replacement fin stack in the replacement fin trench;
    forming a silicon nitride (SiN) cap over the replacement fin wider than the replacement fin;
    removing a portion of the RMG stack on each side of the SiN cap;
    forming a gate all around (GAA) on a remaining portion of the RMG stack and around the replacement fin; and
    forming a trench silicide adjacent to the GAA on the metal routing layer or a dedicated cross-couple (xc) contact through the GAA down to the metal routing layer to connect the GAA and the metal routing layer.

* * * * *